(12) United States Patent
Li et al.

(10) Patent No.: US 11,437,381 B2
(45) Date of Patent: Sep. 6, 2022

(54) INTEGRATED ASSEMBLIES HAVING VOLTAGE SOURCES COUPLED TO SHIELDS AND/OR PLATE ELECTRODES THROUGH CAPACITORS

(71) Applicant: Micron Technology, inc., Boise, ID (US)

(72) Inventors: Jiyun Li, Boise, ID (US); Scott J. Derner, Boise, ID (US)

(73) Assignee: Micron Technology, Inc., Boise, ID (US)

(*) Notice: Subject to any disclaimer, the term of this patent is extended or adjusted under 35 U.S.C. 154(b) by 390 days.

(21) Appl. No.: 16/785,942

(22) Filed: Feb. 10, 2020

(65) Prior Publication Data

US 2021/0249416 A1 Aug. 12, 2021

(51) Int. Cl.
| | |
|---|---|
| *H01L 27/108* | (2006.01) |
| *H01L 23/522* | (2006.01) |
| *G11C 11/408* | (2006.01) |
| *G11C 11/4091* | (2006.01) |
| *G11C 11/4074* | (2006.01) |

(52) U.S. Cl.
CPC .... *H01L 27/10808* (2013.01); *G11C 11/4074* (2013.01); *G11C 11/4085* (2013.01); *G11C 11/4091* (2013.01); *H01L 23/5225* (2013.01)

(58) Field of Classification Search
None
See application file for complete search history.

(56) References Cited

U.S. PATENT DOCUMENTS

| | | | | |
|---|---|---|---|---|
| 6,064,588 A | * | 5/2000 | Crafts | G11C 5/14 365/63 |
| 10,896,722 B1 | | 1/2021 | Li et al. | |
| 2012/0213028 A1 | * | 8/2012 | Ting | G11C 7/18 365/230.01 |

* cited by examiner

*Primary Examiner* — James G Norman
(74) *Attorney, Agent, or Firm* — Wells St. John P.S.

(57) ABSTRACT

Some embodiments include an integrated assembly having first conductive lines which extend along a first direction, and having second conductive lines over the first conductive lines and which extend along a second direction that crosses the first direction. Capacitors are over the second conductive lines. The second conductive lines are operatively proximate active structures to gatedly couple a first set of the capacitors to the first conductive lines through the active structures. Shield structures are between the first conductive lines and extend along the first direction. A voltage source is electrically coupled to the shield structures through a second set of the capacitors. Some embodiments include assemblies having two or more decks stacked one atop another.

35 Claims, 16 Drawing Sheets

US 11,437,381 B2

1

INTEGRATED ASSEMBLIES HAVING VOLTAGE SOURCES COUPLED TO SHIELDS AND/OR PLATE ELECTRODES THROUGH CAPACITORS

TECHNICAL FIELD

Integrated assemblies (e.g., memory devices). Integrated memory having voltage sources coupled to shields and/or plate electrodes through capacitors. Multi-deck assemblies.

BACKGROUND

Memory is utilized in modern computing architectures for storing data. One type of memory is Dynamic Random-Access Memory (DRAM). DRAM may provide advantages of structural simplicity, low cost and high speed in comparison to other types of memory.

DRAM may utilize memory cells which have one capacitor in combination with one transistor (so-called 1T-1C memory cells). The capacitor may have one node coupled with a first source/drain region of the transistor, and may have another node coupled with a common plate, CP. The common plate may be coupled with any suitable voltage, such as a voltage within a range of from greater than or equal to ground to less than or equal to VCC (i.e., ground≤CP≤VCC), where VCC is a supply voltage. In some applications, the common plate is at a voltage of about one-half VCC (i.e., about VCC/2). The transistor may have a gate coupled to a wordline (i.e., access line), and may have a second source/drain region coupled to a bitline (i.e., digit line or sense line). In operation, an electric field generated by voltage along the wordline may gatedly couple the bitline to the capacitor during read/write operations.

A continuing goal of integrated circuit fabrication is to increase packing density and to thereby increase the level of integration. One approach toward such goal is to stack multiple decks of memory on top of one another. However, difficulties are encountered in accessing the various components of the decks for coupling to control circuitry.

Another problem associated with conventional integrated arrangements can be that some components (e.g., common plates) are large conductive expanses, and it can be difficult to maintain a desired stable voltage across such large conductive expanses.

It would be desirable to develop improved architectures.

BRIEF DESCRIPTION OF THE DRAWINGS

FIG. 4A is along the lines A-A of FIGS. 4 and 4B, and FIG. 4B is along the lines B-B of FIGS. 4 and 4A.

2

Figure 6:
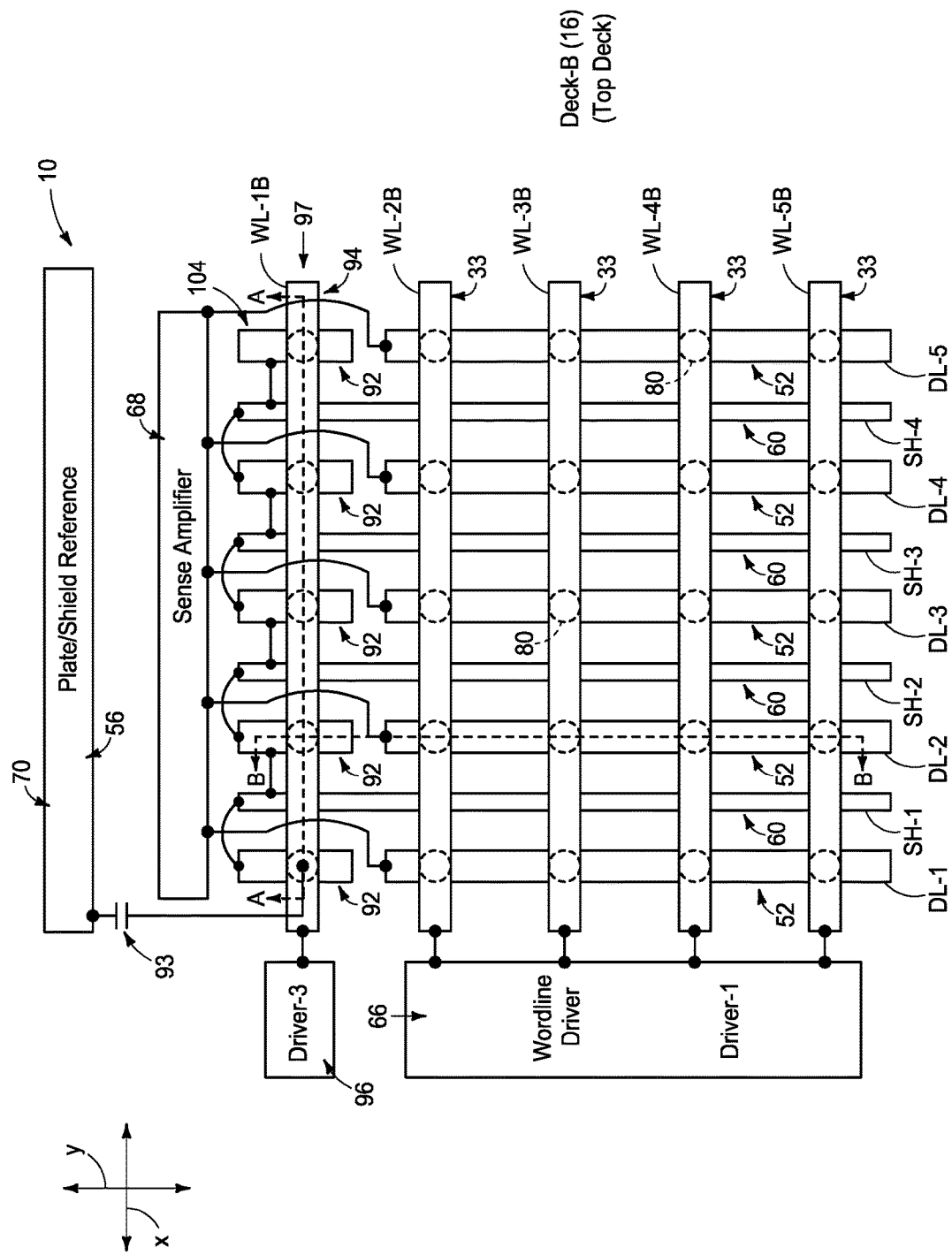

FIG. 6 is a diagrammatic top-down view of a region of an example memory arrangement of an upper deck.

Figure 5:
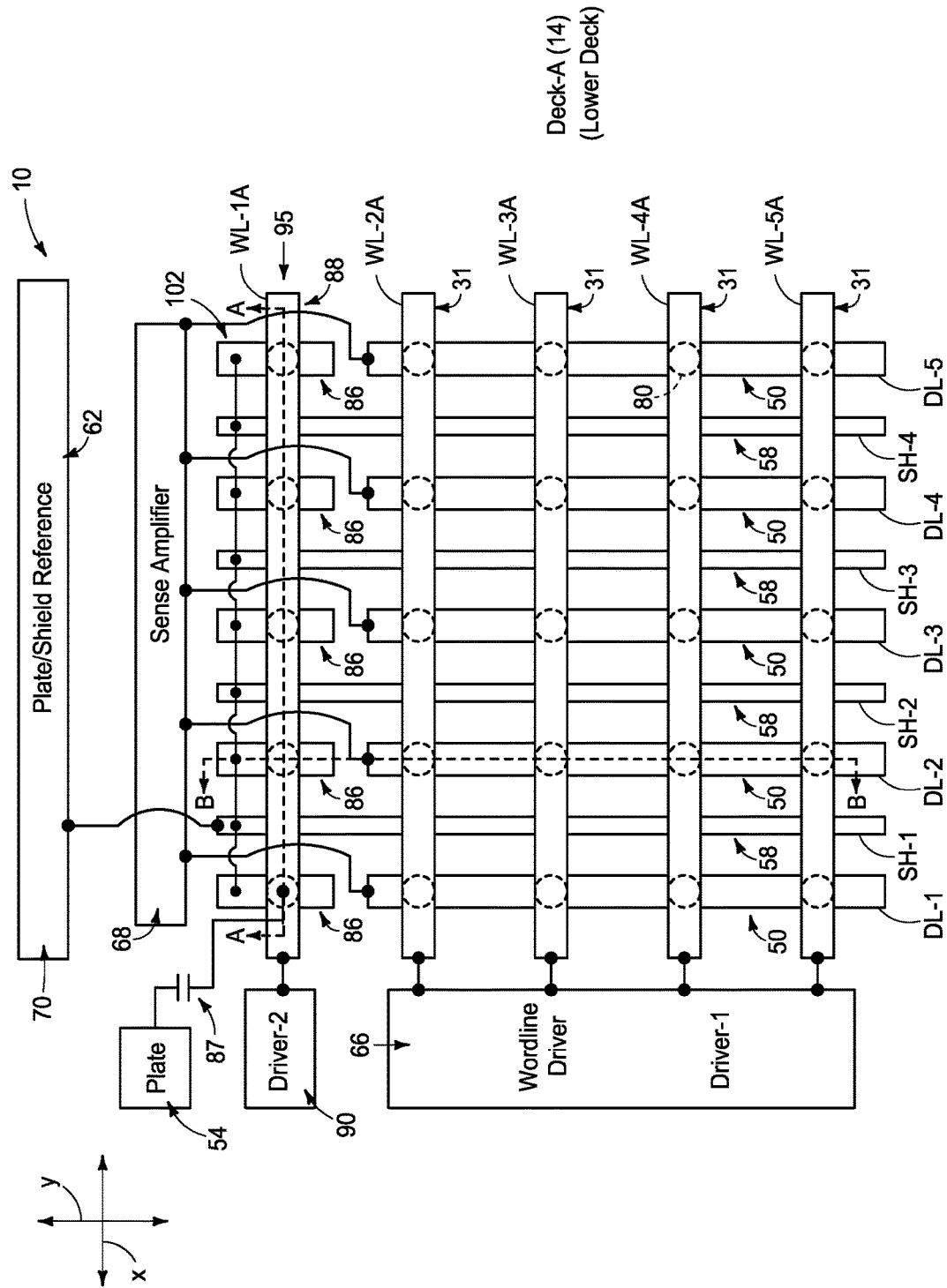
FIG. 5 is a diagrammatic top-down view of a region of an example memory arrangement of a lower deck.
Figure 7A:
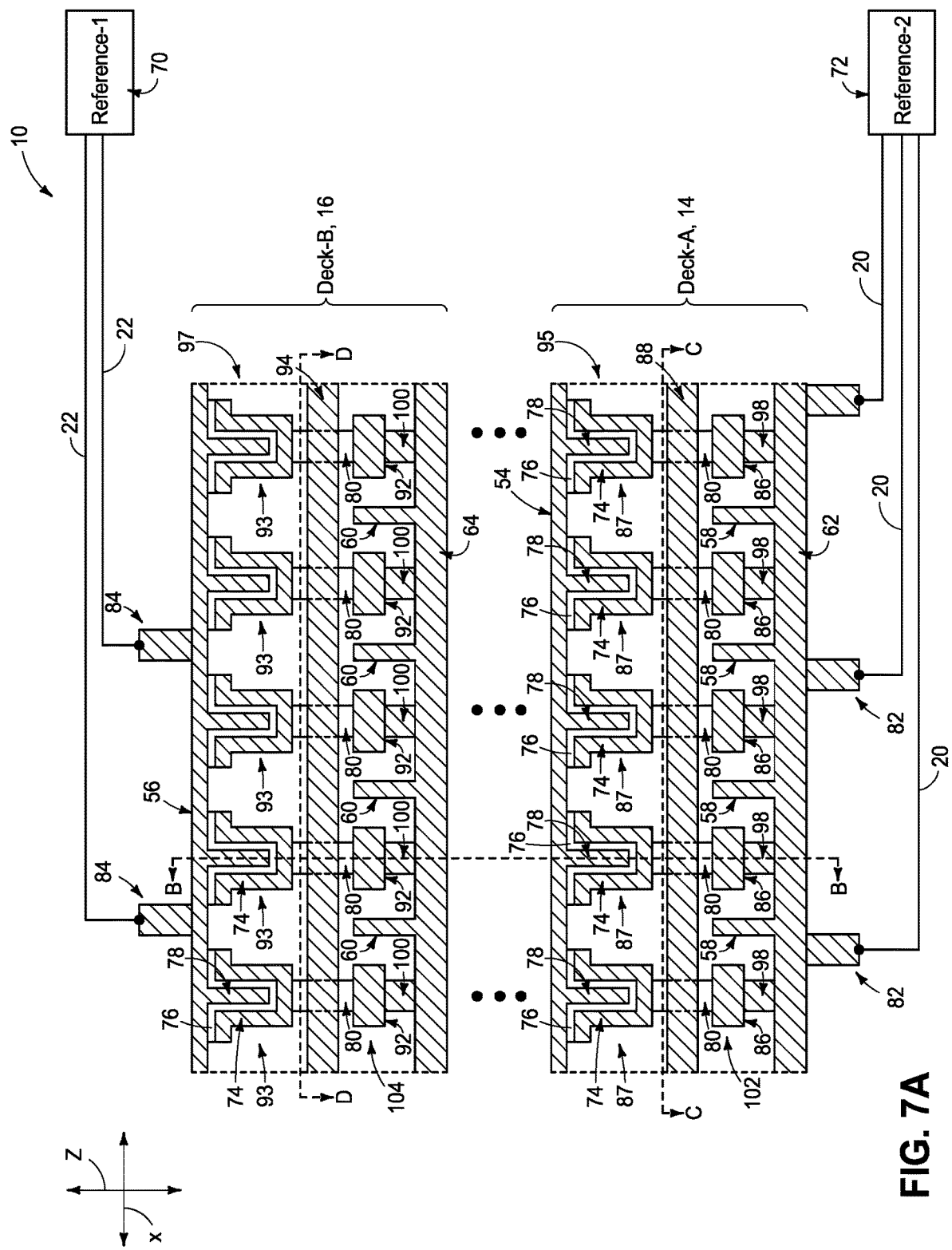
Figure 7B:
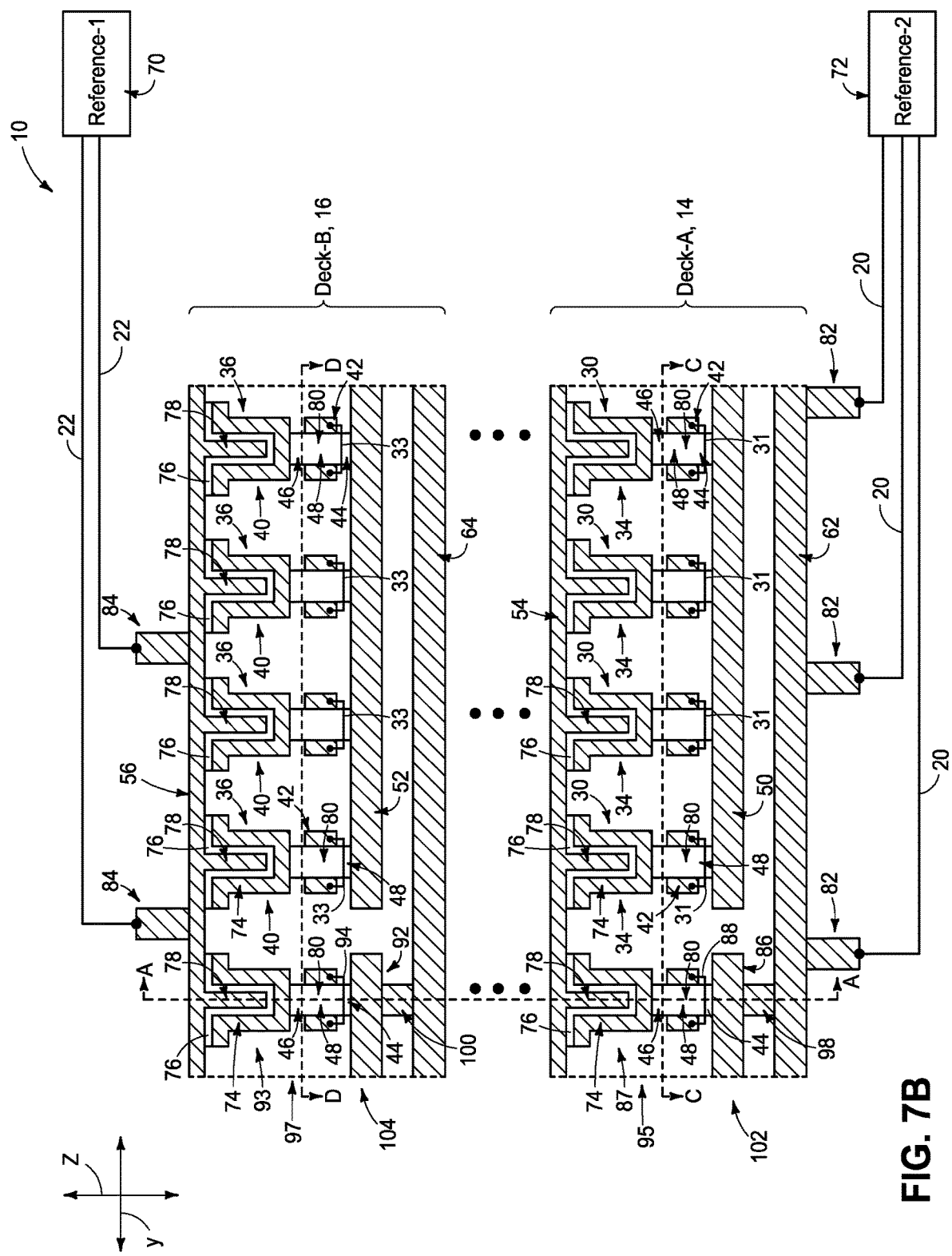

FIGS. 7A and 7B are diagrammatic cross-sectional side views of an example multi-deck arrangement comprising the regions of FIGS. 5 and 6 along the lines C-C and D-D, respectively, of the lower and upper decks. FIG. 7A is along the lines A-A of FIGS. 5, 6 and 7B; and FIG. 7B is along the lines B-B of FIGS. 5, 6 and 7A.

FIGS. 8-11 are diagrammatic top-down/schematic views of regions of example integrated assemblies associated with an upper deck of a multi-deck assembly.

DETAILED DESCRIPTION OF THE ILLUSTRATED EMBODIMENTS

Some embodiments include multi-deck assemblies in which a second memory array deck is over a first memory array deck. A top of the first memory array deck includes a first conductive expanse (e.g., a common plate extending across capacitors of the memory array), and bottom of the second deck includes a second conductive expanse (e.g., a conductive plate coupled with shield structures). A first voltage source is electrically coupled to the first conductive expanse through one or more interconnects laterally adjacent memory cells of the first memory array deck, with such coupling extending through one or more first access capacitors. A second voltage source is electrically coupled to the second conductive expanse through one or more interconnects laterally adjacent memory cells of the second memory array deck, with such coupling extending through one or more second access capacitors. Example embodiments are described with reference to FIGS. 1-11.

Figure 1:
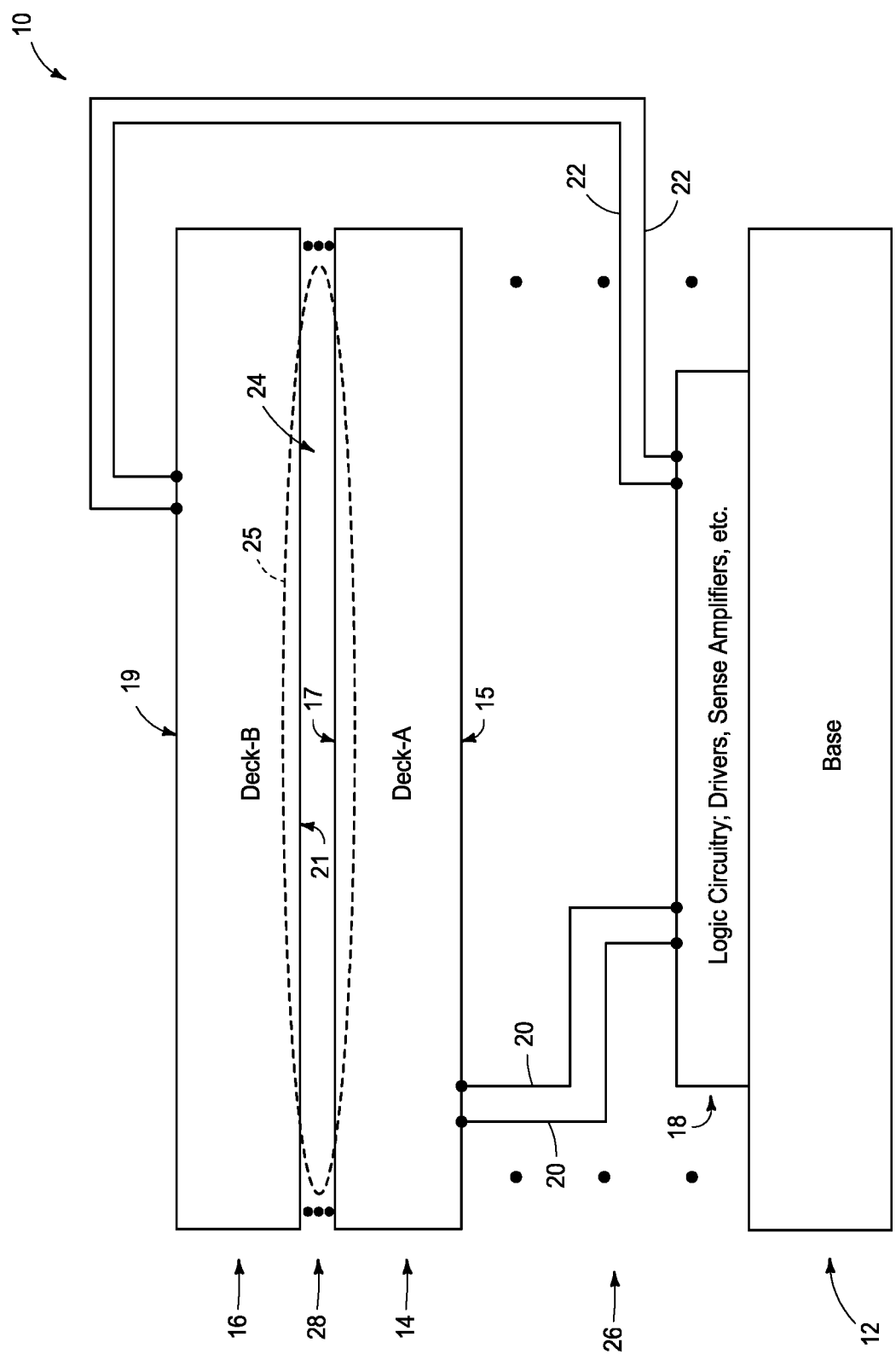
FIG. 1 is a diagrammatic cross-sectional side view of an example multi-deck arrangement.

FIG. 1 shows an integrated assembly (arrangement) 10 which includes multiple decks. Specifically, the assembly 10 includes a base 12, and a pair of decks 14 and 16 over the base. The decks 14 and 16 are labeled as Deck-A and Deck-B, respectively. In some embodiments, one of the decks 14 and 16 may be referred to as a first deck and the other may be referred to as a second deck. Alternatively, the base 12 may be referred to as a first deck, and the decks 14 and 16 may be referred to as second and third decks, respectively.

In the illustrated embodiment, logic circuitry (e.g., drivers, sense amplifiers, etc.) is associated with the base 12, and is supported by such base. The decks 14 and 16 are also supported by the base 12, and are over the logic circuitry 18. In some embodiments, an entirety of the logic circuitry 18 may be directly under the decks 14 and 16 (as shown). In other embodiments, at least some of the logic circuitry 18 may be in another location rather than being directly below the decks 14 and 16. For instance, at least some of the logic circuitry 18 may be laterally outward of the decks 14 and 16, may be over the decks 16, etc.

The decks 14 and 16 may comprise memory cells of memory arrays. The memory arrays may include wordlines, digit lines, capacitors, etc. It may be desired to electrically couple components of the memory arrays with regions of the logic circuitry 18. For instance, it may be desired to couple wordlines with wordline drivers, to couple digit lines with sense amplifiers, to couple capacitor plate electrodes (the common plate) with an appropriate voltage source, etc.

In the illustrated embodiment, the lower deck 14 has a bottom surface 15 which is easily accessible for coupling with the logic circuitry 18; and electrical connections 20 are shown extending from the logic circuitry to circuit elements (not shown) along the bottom surface 15. Similarly, the upper deck 16 has an upper surface 19 which is easily accessible for coupling with the logic circuitry 18; and electrical connections 22 are shown extending from the logic circuitry to circuit elements (not shown) along the upper surface 19.

The lower deck 14 also has a top surface 17 in opposing relation to the bottom surface 15, and the upper deck 16 has a bottom surface 21 in opposing relation to the top surface 19. The surfaces 17 and 21 are more difficult to access than the surfaces 15 and 19 due to the decks 14 and 16 interfering with the access to the surfaces 17 and 21. A region 24 between the decks 14 and 16 is diagrammatically bounded with a dashed line 25. The region 24 represents a region which is difficult to access between the decks 14 and 16.

A gap 26 is shown between the base 12 and the deck 14, and another gap 28 is shown between the decks 14 and 16. One or more additional materials may be within such gaps. Alternatively, the gaps 26 and 28 may be effectively nonexistent.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

The logic circuitry 18, deck 14 and deck 16 may correspond to levels (tiers) of circuitry formed over the base 12. The base 12 may correspond to a semiconductor die; and the circuitry 18, deck 14 and deck 16 may correspond tiers of circuitry associated with the same semiconductor die. Alternatively, one or both of the decks 14 and 16 may correspond to a separate semiconductor die relative to the die of the base 12.

Figure 2:
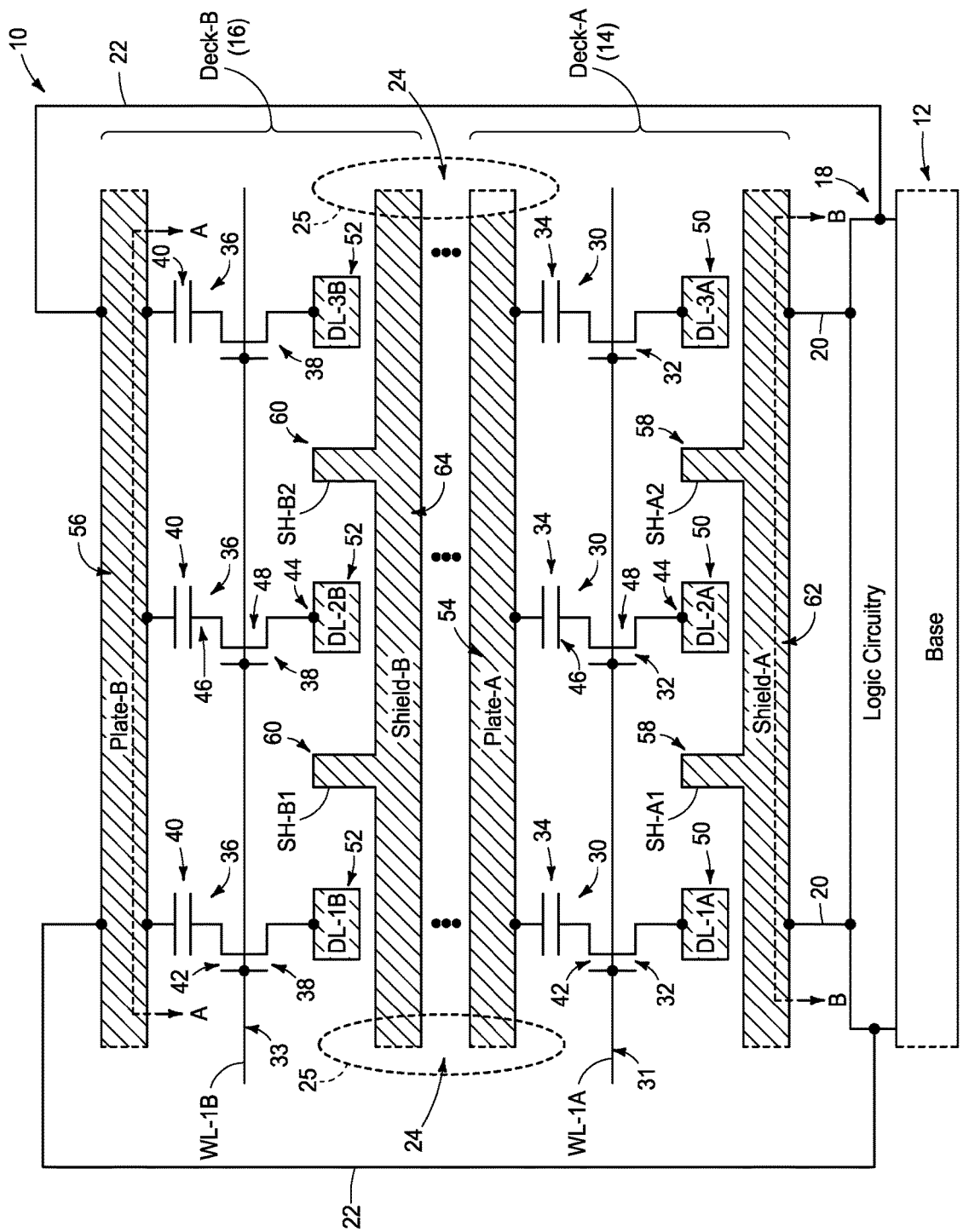
FIG. 2 is another diagrammatic cross-sectional side view of an example multi-deck arrangement.

FIG. 2 shows the assembly 10 in a particular configuration in which the decks 14 and 16 include memory cells. Specifically, the deck 14 includes memory cells 30, with each of such memory cells including an access transistor 32 and a capacitor 34; and the deck 16 includes memory cells 36, with each of such memory cells including an access transistor 38 and a capacitor 40.

The access transistors 32 have gates 42 (only one of which is labeled) along a wordline 31 (WL-1A), and the access transistors 38 have gates 42 (only one of which is labeled) along a wordline 33 (WL-1B). The wordlines may be electrically coupled with wordline drivers within the logic circuitry 18. Such coupling is not shown in FIG. 2 to simplify the drawing.

Each of the access transistors 32 and 38 has a first source/drain region 44 and a second source/drain region 46; and has a channel region 48 between the first and second source/drain regions. The source/drain regions and channel regions are only labeled relative to a couple of the transistors.

The first and second source/drain regions 44 and 46 are gatedly coupled one another through the channel regions 48. Specifically, operation of a wordline (e.g., WL-1A) associated with a transistor (e.g., 32) may provide a voltage to the gate 42 which induces an electric field within the channel region 48 to electrically couple the source/drain regions 44 and 46 with one another. Alternatively, if the voltage to the gate 42 is below a threshold level, the source/drain regions 44 and 46 will not be electrically coupled with one another. A wordline may be considered to be in an "ON" state when sufficient voltage is provided along the wordline to induce coupling of source/drain regions along the transistors associated with the wordline, and may be considered to be in a "OFF" state when such sufficient voltage is not provided along the wordline.

The first source/drain regions 44 are electrically coupled with digit lines 50 within the lower deck 14, and are electrically coupled with digit lines 52 within the upper deck 16. The first digit lines 50 are labeled DL-1A, DL-2A and DL-3A so that they may be distinguished relative to one another. Similarly, the second digit lines 52 are labeled DL-1B, DL-2B and DL-3B.

The upper source/drain regions 46 are electrically coupled with the capacitors 34 and 40. Each of the capacitors 34 and 40 has an upper node corresponding to a plate electrode (common plate; CP); with the plate electrode of the lower deck 14 being labeled 54 (Plate-A), and the plate electrode of the upper deck 16 being labeled 56 (Plate-B).

In some applications, operation of a digit line may undesirably disturb a neighboring digit line. Such disturbance may occur through parasitic capacitance and/or through other mechanisms. In the illustrated embodiment, shield structures (shields) 58 are provided between the digit lines 50 of the lower deck 14, and analogous shield structures (shields) 60 are provided between the digit lines 52 of the upper deck 16. The shields 58 are also labeled as SH-A1 and SH-A2, and similarly the shields 60 are also labeled as SH-B1 and SH-B2.

The shield structures 58 extend upwardly from a shield plate 62 (Shield-A), and similarly the shield structures 60 extend upwardly from a shield plate 64 (Shield-B).

The shield plate (Shield-A) 62 is along a bottom of the lower deck 14, and may be readily connected to the logic circuitry 18 (as shown). The illustrated connection occurs through electrical interconnects 20 of the type described above with reference to FIG. 1.

The plate electrode 56 (Plate-B) is along a top of the upper deck 16, and may be readily connected to the logic circuitry 18 (as shown); with such connection occurring through electrical interconnects 22 of the type described above with reference to FIG. 1.

The close proximity of the decks 14 and 16 to one another limits access to the region 24 between the decks which complicates access to the plate electrode 54 (Plate-A) of the lower deck 14 and access to the shield plate 64 (Shield-B) of the upper deck 16.

Figure 2A:
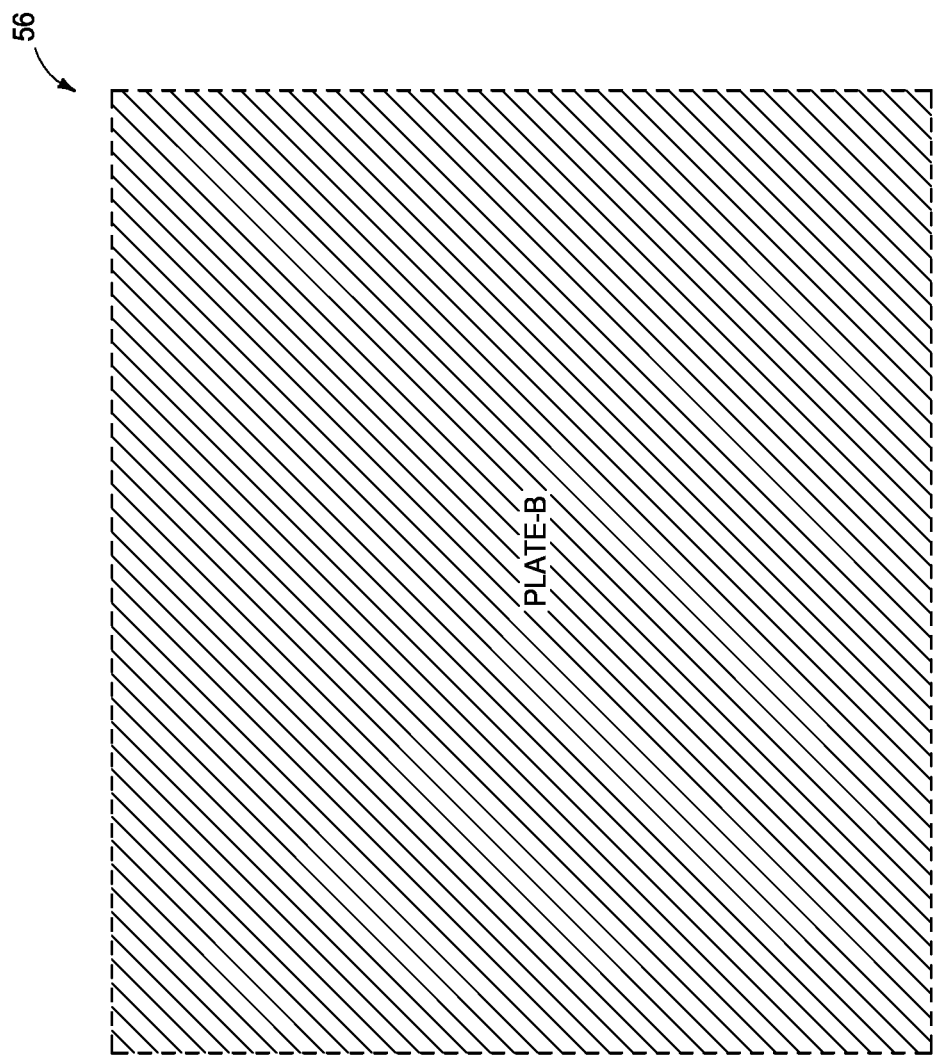
FIGS. 2A and 2B are diagrammatic cross-sectional top-down views along the lines A-A and B-B of FIG. 2, respectively.
Figure 2B:
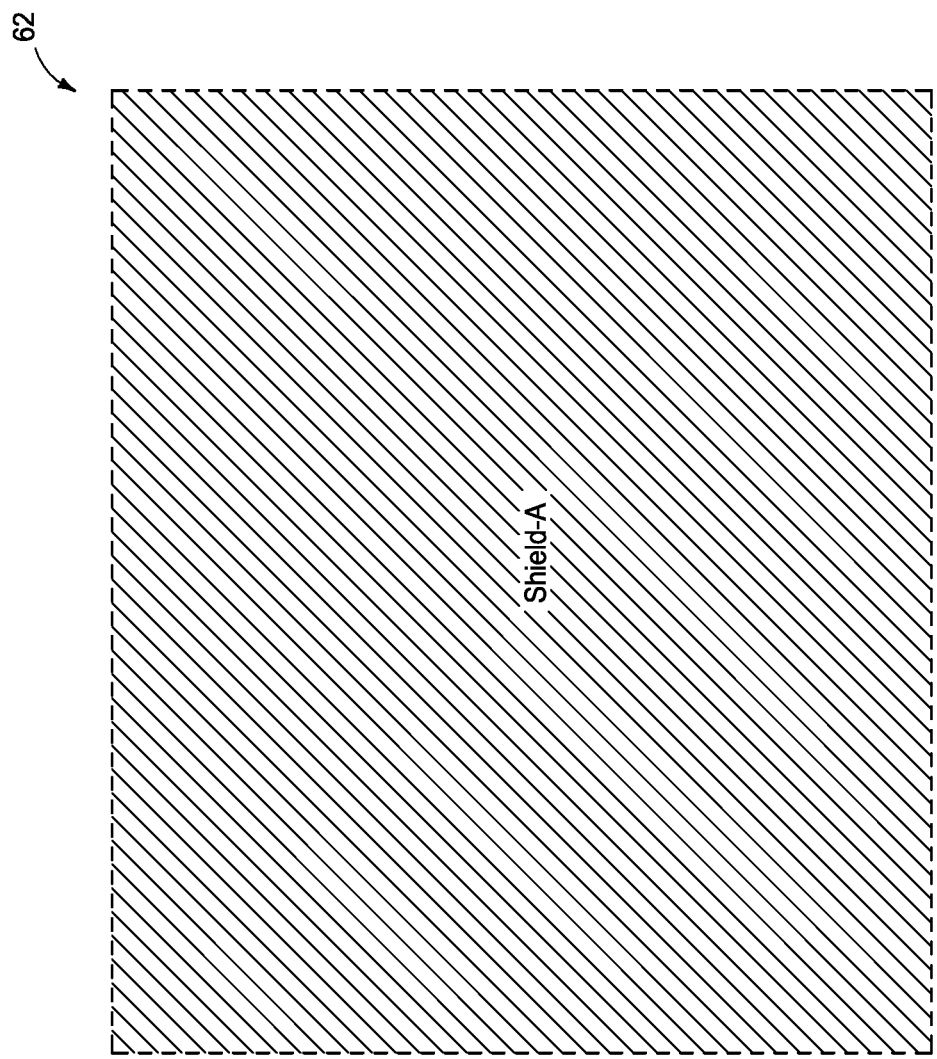

FIGS. 2A and 2B diagrammatically illustrate the plates 56 and 62 in top-down view to indicate that the plates may be large expanses. Such large expanses may reduce access to structures between the plates 56 and 62; and may, for example, reduces access to the plates 54 and 64 within the region 24 of FIG. 2.

Figure 3:
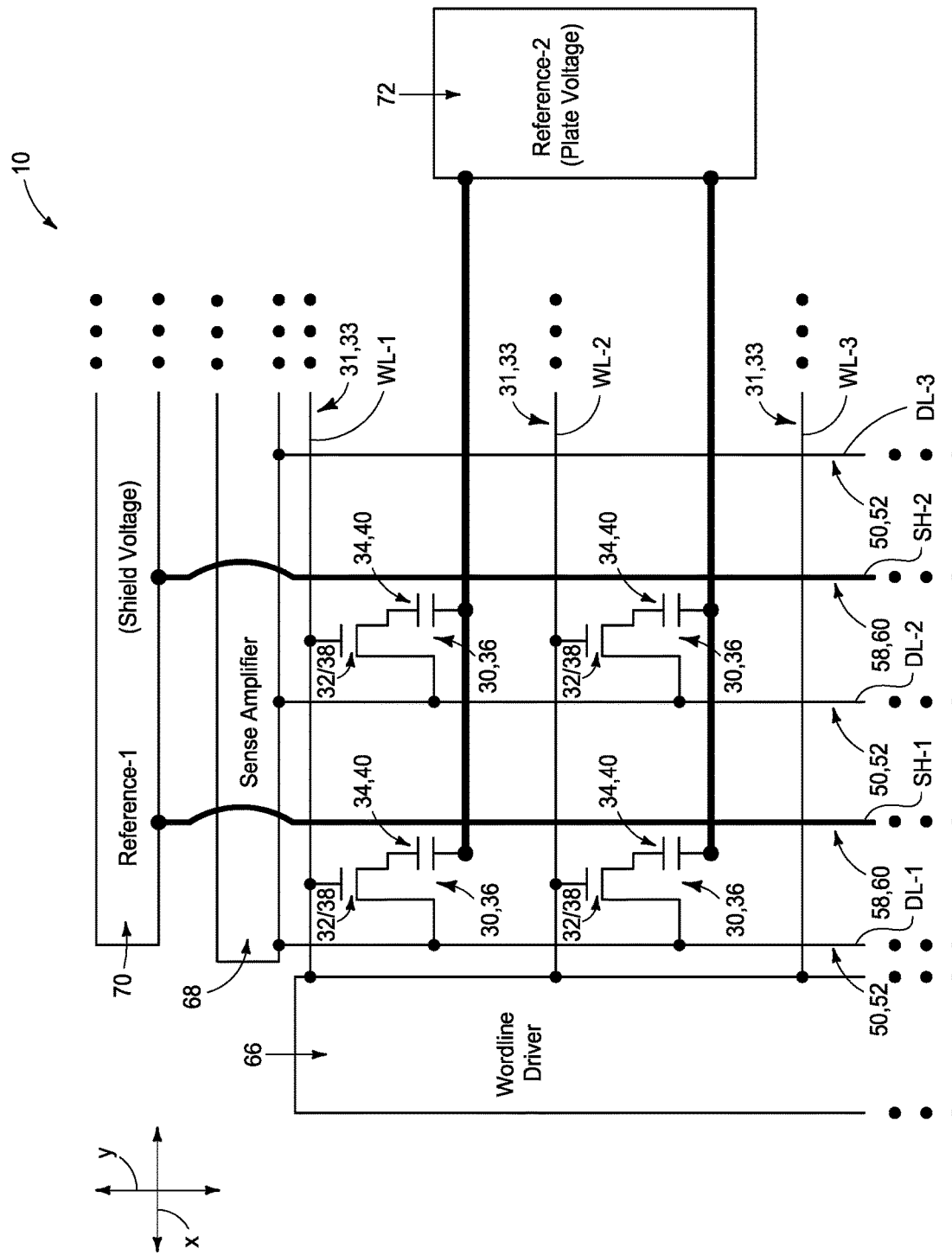
FIG. 3 is a diagrammatic schematic view of a region of an example memory arrangement.

FIG. 3 schematically illustrates an example array of memory cells (30, 36) which may be associated with the decks 14 and 16. The cells include the capacitors (34, 40), with such capacitors being gatedly coupled with digit lines (50, 52) through access transistors (32, 38). The digit lines are labeled as DL-1, DL-2 and DL-3.

The access transistors (32, 38) are along wordlines (31, 33). The wordlines are labeled WL-1, WL-2 and WL-3.

Shield lines (58, 60) are between the digit lines to reduce undesired cross-talk (e.g., parasitic capacitance) between neighboring digit lines. The shield lines are labeled as SH-1 and SH-2.

The wordlines (31, 33) are electrically coupled with wordline-driver-circuitry (Wordline Driver) 66, the digit lines (50, 52) are coupled with sense-amplifier-circuitry (Sense Amplifier) 68, the shield lines (58, 60) are electrically coupled with a first reference voltage (Reference-1; Shield Voltage) 70, and the plate electrodes of the capacitors (34, 40) are electrically coupled with a second reference voltage (Reference-2; Plate Voltage). The circuit components 66, 68, 70 and 72 may be comprised by the logic circuitry 18 of FIGS. 1 and 2. In some embodiments, the first and second reference voltage sources 70 and 72 may be the same as one another (e.g., may be ground, VCC/2, etc.,) and may be comprised by a common reference voltage source.

An axis system is provided in FIG. 3 to assist the reader in understanding the orientation of the various features of the assembly 10. The axis system includes a y-axis crossing an x-axis, and extending orthogonally relative to the x-axis. The wordlines (31, 33) of the assembly 10 extend along a first direction corresponding to the x-axis direction, and the digit lines (50, 52) extend along a second direction corresponding to the y-axis direction. Although the second direction of the digit lines is shown to be orthogonal to the first direction of the wordlines, in other embodiments the digit lines may extend along a second direction which crosses the first direction of the wordlines, but which is not orthogonal to such first direction.

The shield lines (58, 60) extend along the same direction as the digit lines (50, 52).

Figure 4:
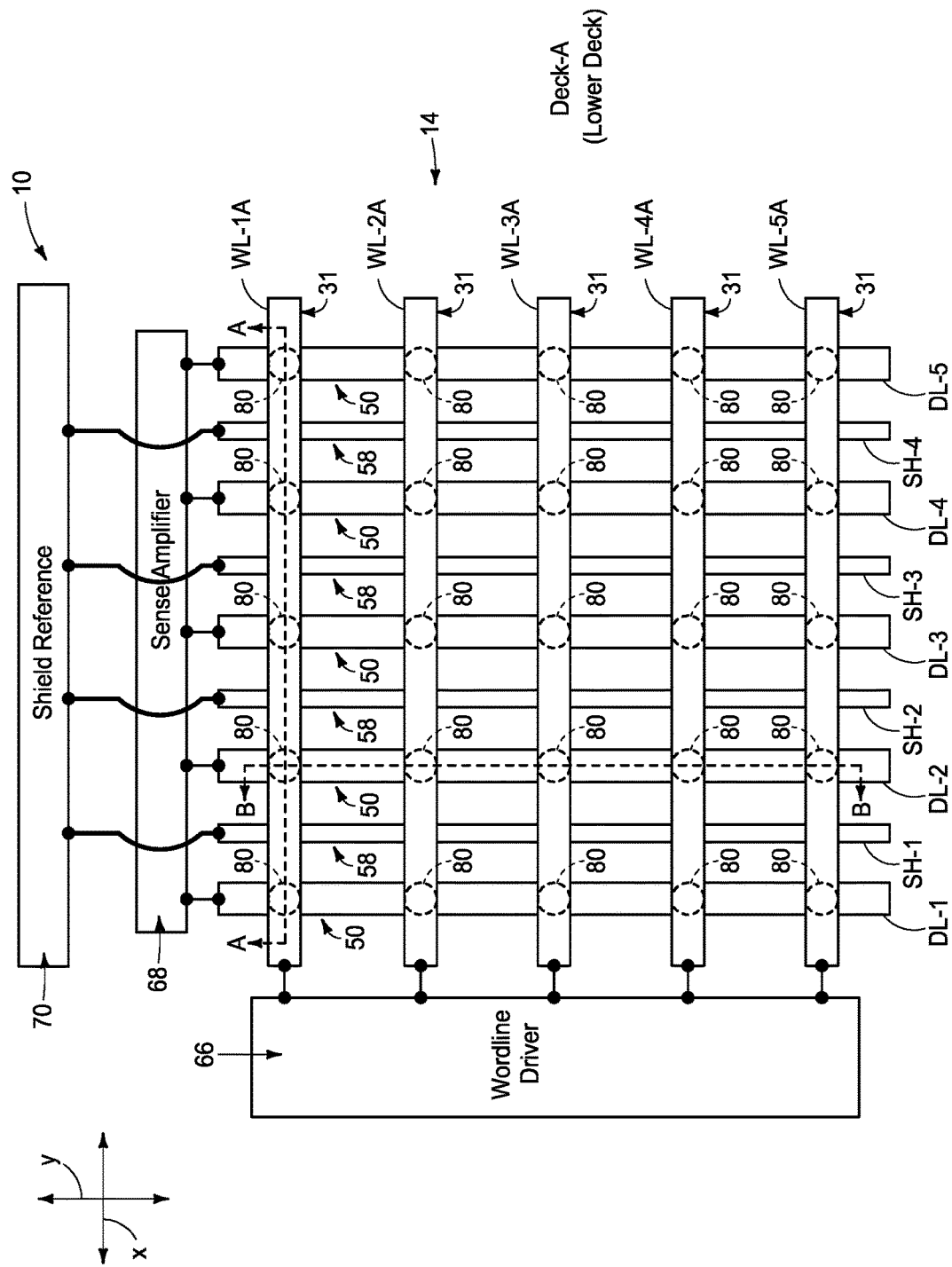
FIG. 4 is a diagrammatic top-down view of a region of an example memory arrangement.
Figure 4A:
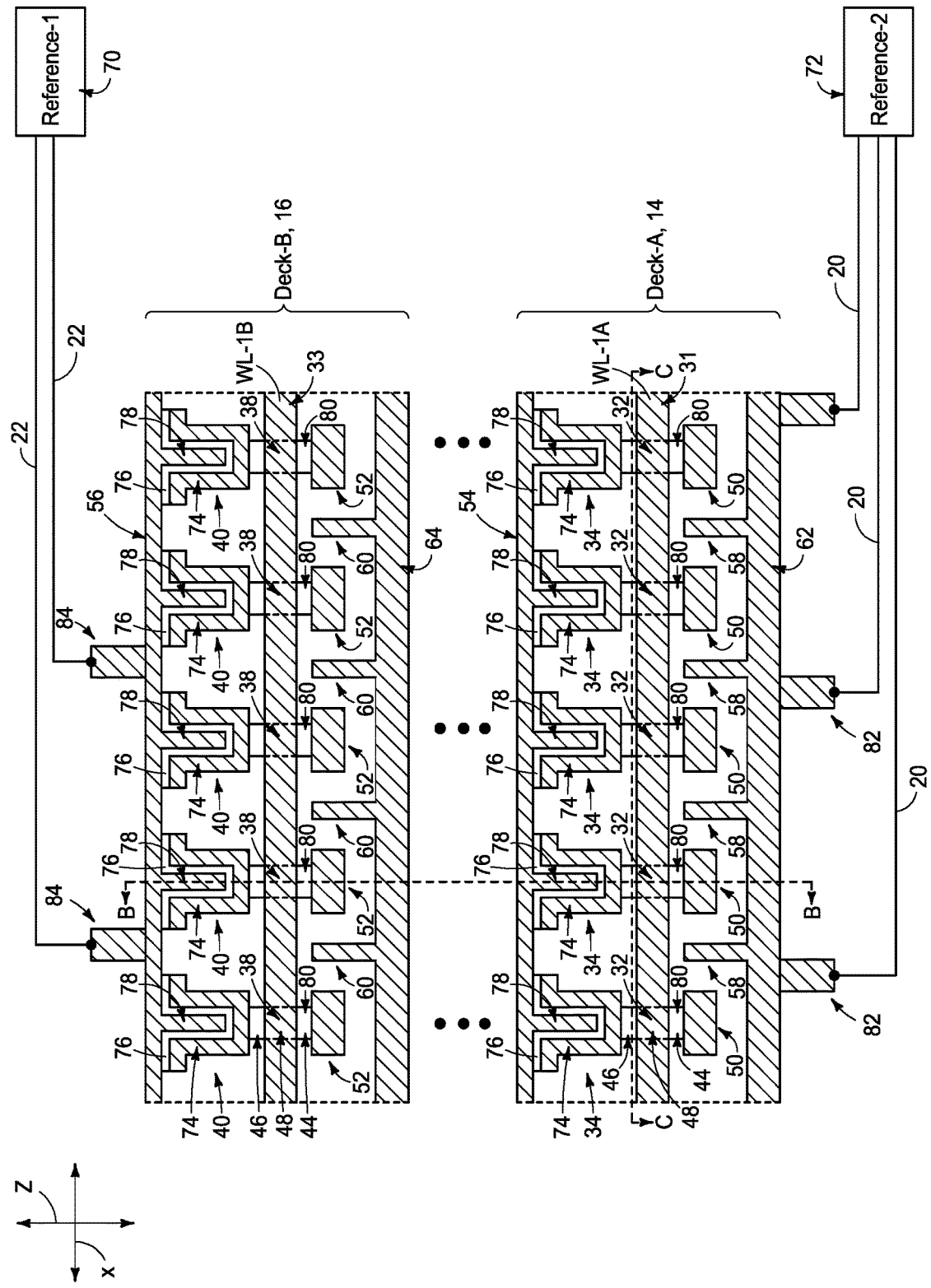
FIGS. 4A and 4B are diagrammatic cross-sectional side views of an example multi-deck arrangement comprising the region of FIG. 4 along the line C-C of the lower deck.
Figure 4B:
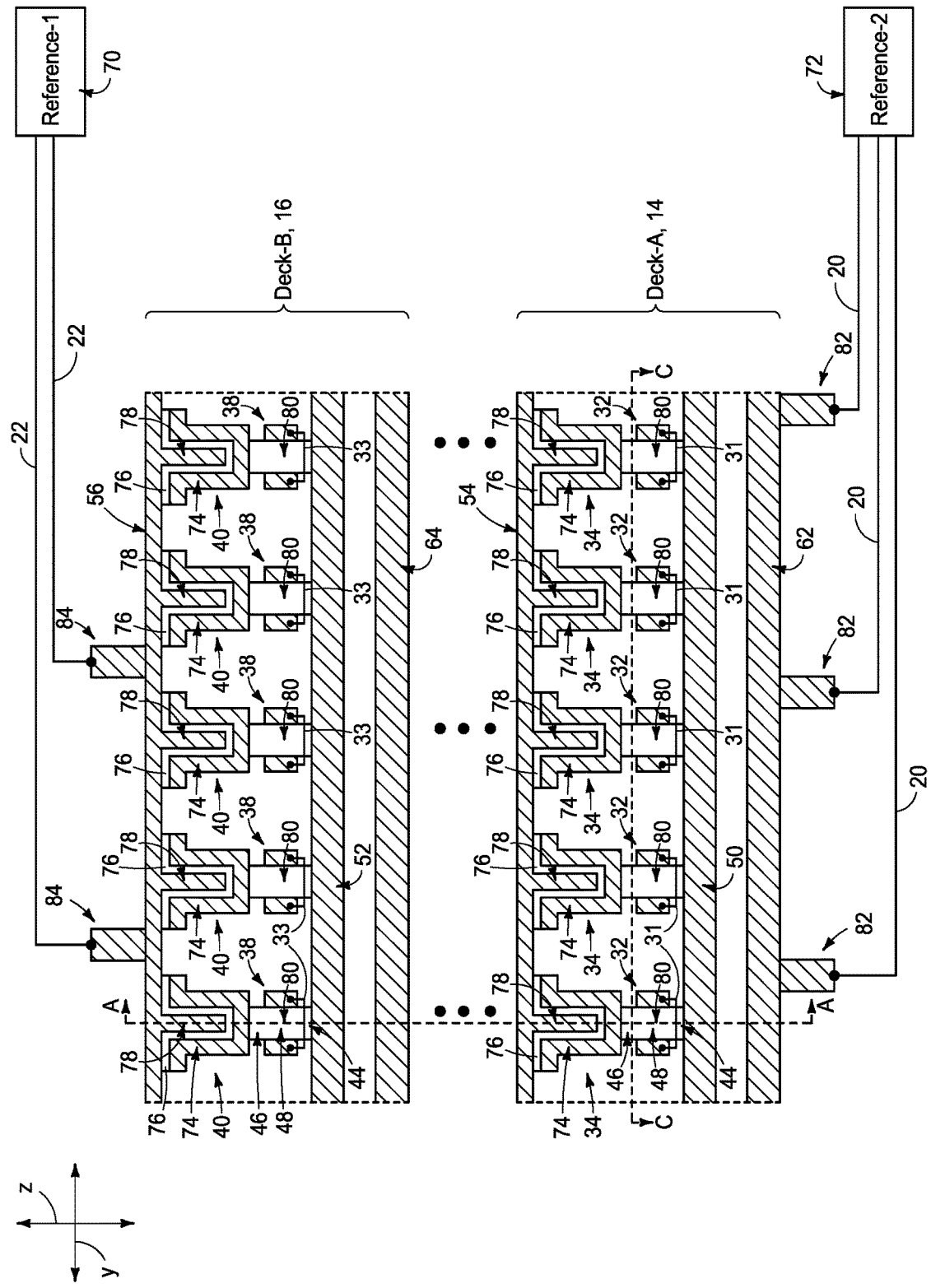

FIGS. 4-4B show an example configuration of the integrated assembly 10. FIG. 4 shows a region of the lower deck 14 (Deck-A) along a cross-section C-C of FIGS. 4A and 4B; and FIGS. 4A and 4B are along the cross-sections A-A and B-B, respectively, of FIG. 4. An axis system comprising an x-axis, y-axis and z-axis is provided within FIGS. 4-4B to assist the reader in understanding the relative orientation of the figures.

The capacitors 34 and 40 are shown in FIGS. 4A and 4B to each include a first electrode (storage node) 74, an insulative material (capacitor dielectric material) 76, and a second electrode (plate electrode) 78. In the illustrated embodiment, the storage nodes (first capacitor nodes) 74 are shaped as upwardly-opening containers, and the dielectric material 76 and plate electrodes (second capacitor nodes) 78 extend down into such upwardly-opening containers. The plate electrodes 78 are part of a continuous conductive expanse that extends across the capacitors; with such expanse being the plate 56 of the upper deck 16 or the plate 54 of the lower deck 14.

The storage nodes 74 are over vertically-extending pillars 80. The pillars 80 may comprise semiconductor material; such as, for example, silicon. The pillars 80 include the source/drain regions 44 and 46, and the channel regions 48. Only some of the source/drain regions and channel regions are labeled to simplify the drawings.

The transistors 32 and 38 include the regions 44, 46 and 48 of the vertically-extending pillars 80, and include regions of the wordlines (31, 33) along the channel regions 48 and operatively proximate such channel regions to function as transistor gates which selectively (gatedly) couple the source/drain regions 44 and 46 with one another.

The digit lines (50, 52) are along the source/drain regions 44 at the bottoms of the vertically-extending pillars 80, and the storage nodes 74 of the capacitors (34, 40) are along the source/drain regions 46 at the tops of the vertically-extending pillars 80. Accordingly, when sufficient voltage is applied along a wordline (31, 33) to gatedly couple the source/drain regions 44 and 46 with one another, such may establish a current flow between the capacitors (34, 40) and the digit lines (50, 52).

The shield lines (58, 60) extend upwardly from the shield plates (62, 64). In the illustrated embodiment, the shield plates extended to under the digit lines (50, 52).

FIGS. 4A and 4B show projections 84 extending upwardly from the plate electrode 56 of the upper deck 16, and show projections 82 extending downwardly from the shield plate 62 of the lower deck 14. The projections 82 and 84 may be considered to be electrical interconnects, and are utilized for connecting the conductive expanses (conductive plates) 62 and 56 to the voltage sources 70 and 72. It is more difficult to connect the plates 54 and 64 between the decks 14 and 16 to reference sources.

Regions of the vertically-extending pillars 80 are shown in dashed-line view in FIG. 4A to indicate that such regions are behind the cross-section of the figure, and specifically are behind the illustrated wordlines (31, 33). Regions of the pillars 80 are diagrammatically illustrated in dashed-line view in FIG. 4 to assist the reader in understanding the relationship of the vertically-extending pillars to the illustrated wordlines 31 and digit lines 50 of FIG. 4.

Some embodiments include assemblies in which one or more of the digit lines (50, 52) are cut to leave fragments at the edge of a deck. The fragments may be utilized for coupling to circuitry external of the deck, and accordingly for routing electrical input from a voltage source to the plates 54 and 64 between the decks 14 and 16. In some embodiments, some of the capacitors (34, 40) remain associated with the fragments which have been cut from the digit lines, and such capacitors are within the circuit which routes the electrical input from the voltage source to the plates 54 and 64. The capacitors may advantageously stabilize the flow of the voltage directed to the expanses (plates) 54 and 64 to reduce undesired fluctuations of such voltage. FIGS. 5 and 6 illustrate regions of the decks 14 and 16 in applications in which fragments of the digit lines are cut to form interconnects for coupling to circuitry external of the decks.

Referring to FIG. 5, the digit lines 50 are broken to leave fragments 86 under the wordline WL-1A. Such fragments 86 are electrically coupled to the shields 58, and accordingly are electrically coupled to the plate/shield reference voltage 70. The fragments 86 are also electrically coupled to the plate electrode 54 through access capacitors 87 (with such access capacitors being analogous to the capacitors 34 described above with reference to FIG. 4A). The fragments 86 are laterally aligned with the digit lines 50, and are in one-to-one correspondence with the digit lines 50. In some embodiments, the fragments 86 may be referred to as conductive structures.

The wordline WL-1A becomes a gating line 88 which gates the digit line fragments 86 to the plate 54 through the transistors 32 (with such transistors being described above with reference to FIG. 4A). The gating line 88 is electrically coupled with a driver 90 (Driver-2). The driver 90 may be part of the wordline-driver-circuitry 66 (Driver-1), or may be separate from the wordline-driver-circuitry 66. The configuration of FIG. 5 may enable the shield plate 62 to be utilized as a voltage source for the capacitor plate 50, with such voltage passing through the access capacitors 87. The access capacitors 87 associated with the fragments 86 may stabilize the voltage provided within the plate 54.

The fragments 86 and the associated gating line 88 may be together considered to be within an interconnect region 95, with such interconnect region being utilized for establishing an electrical connection between the plate (conductive expanse) 62 and the plate (conductive expanse) 54.

Referring to FIG. 6, the digit lines 52 are broken to leave fragments 92 under the wordline WL-1B. Such fragments 92 are electrically coupled to the shields 60. The fragments 92 are also electrically coupled to the plate electrode 56 through access capacitors 93 (with such capacitors being analogous to the capacitors 40 described above with reference to FIG. 4A). The fragments 92 are laterally aligned with the digit lines 52, and are in one-to-one correspondence with the digit lines 52. In some embodiments, the fragments 92 may be referred to as conductive structures.

The wordline WL-1B becomes a gating line 94 which gates the digit line fragments 92 to the plate 56 through the transistors 38 (with such transistors being described above with reference to FIG. 4A). The gating line 94 is electrically coupled with a driver 96 (Driver-3). The driver 96 may be part of the wordline-driver-circuitry 66 (Driver-1), or may be separate from the wordline-driver-circuitry 66. The configuration of FIG. 6 may enable the plate 56 to be utilized as a voltage source for providing voltage to the shields 60, with such voltage passing through the access capacitors 93. The access capacitors 93 may stabilize the voltage provided to the shields 60.

The fragments 92 and the associated gating line 94 may be together considered to be within an interconnect region 97, with such interconnect region being utilized for establishing an electrical connection between the plate (conductive expanse) 56 and the shield structures (shields) 60.

In some applications, the fragments 86 within the first interconnect region 95 may be considered to be together electrically coupled (electrically tied, electrically ganged) into a first interconnect structure 102, and the fragments 92 within the second interconnect region 97 may be considered to be together electrically coupled (electrically tied, electrically ganged) into a second interconnect structure 104. The first interconnect structure 102 is laterally offset from the digit lines 50, and the second interconnect structure 104 is laterally offset from the digit lines 52.

The first and second gating lines 88 and 94 may be considered to be directly over the first and second interconnect structures 102 and 104.

The configurations of FIGS. 5 and 6 are described relative to the stacked decks 14 and 16 in cross-sectional side views of FIGS. 7A and 7B. The view of FIG. 7A is along the lines A-A of FIGS. 5 and 6, and the view of FIG. 7B is along the lines B-B of FIGS. 5 and 6.

The decks 14 and 16 each comprise digit lines (50, 52) and wordlines (31, 33). In some embodiments, the digit lines (50, 52) may be considered to be first conductive lines which extend along a first direction (e.g., the y-axis direction), and the wordlines (31, 33) may be considered to be second conductive lines which extend along a second direction (e.g., the x-axis direction); with the second direction crossing the first direction. The capacitors (34, 40) are over the wordlines (31, 33). The digit lines (50, 52) may be electrically coupled with sense-amplifier-circuitry and the wordlines (31, 33) may be electrically coupled with wordline-driver-circuitry, as shown in FIGS. 5 and 6.

Active structures (e.g., the semiconductor pillars 80) extend from the digit lines (50, 52) to the lower nodes 74 of the capacitors (34, 40). The wordlines (31, 33) are operatively proximate the active structures 80 to gatedly couple the capacitors to the digit lines through the active structures. More specifically, the active structures 80 include channel regions 48, and the wordlines (31, 33) include gates 42 which are along the channel regions 48 and which can provide appropriate electric fields within the channel regions to induce electrical conduction across the channel regions.

The shield structures (58, 60) extend between the digit lines (50, 52), as shown in FIGS. 5 and 6. The cross-section of FIG. 7A also shows the shield structures 58 and 60 extending between the fragments 86 and 92. Further, FIG. 7A shows the shield plate 62 electrically coupled with the fragments 86 through conductive interconnects 98, and shows the shield plate 64 electrically coupled with the fragments 92 through conductive interconnects 100.

In some embodiments, the capacitors 34 and 40 may be considered to be within the memory cells 30 and 36, respectively. Such memory cells may be within memory arrays. The capacitors 87 and 93 may be considered to be laterally outward of the memory cells. The capacitors 34 and 40 may be considered to correspond to a first set of capacitors (memory cell capacitors), and the capacitors 87 and 93 may be considered to correspond to a second set of capacitors (access capacitors).

FIGS. 7A and 7B show that the fragments (86, 92), together with the interconnects (98, 100) and the capacitors (87, 93), may be utilized as a conductive path from an outer surface of a deck to an inner surface of such deck within the multi-deck assembly 10. Specifically, the outer plate 62 of the lower deck 14 is coupled with the reference source 72, and accordingly may be at a desired reference voltage. The plate 62 is coupled through the interconnects 98, the fragments 86, the active regions 80 and the capacitors 87 to the inner plate 54 (the capacitor plate). Accordingly, the capacitor plate 54 may be electrically coupled with the reference source 72 utilizing the connections 82 along the lower plate 62. Analogously, the outer plate 56 (the capacitor plate) of the upper deck 16 is coupled with the reference source 70, and accordingly may be at a desired reference voltage. The plate 56 is coupled through the capacitors 93, the active regions 80, the fragments 92 and the interconnects 100 to the inner plate 64 (the shield plate) of the upper deck within the multi-deck assembly 10. Accordingly, the shield plate 64 may be electrically coupled with the reference source 70 utilizing the connections 84 along the upper plate 56.

The connection from the reference source 72 to the capacitor plate 54 extends through the capacitors 87. Such may advantageously provide a more stable voltage to the capacitor plate than would be achieved in the absence of the capacitors. The overall capacitance provided between the plate 54 and the source 72 may be determined by the number of intervening capacitors 87 and the capacitance within the individual capacitors. Specifically, the overall capacitance may be estimated utilizing the relationship that the overall capacitance is approximately equal to (number of cells/row) *(number of rows)*(capacitance per capacitor) for the interconnect region 95. In the illustrated embodiment, the interconnect region 95 comprises only a single row. In other embodiments (described below), the interconnect region 95 may comprise two or more rows. The overall capacitance (total capacitance) provided by the access capacitors 87 of the lower deck 14 may be within a range of from about 3 picofarads (pF) to about 30 pF, within a range of from about 5 pF to about 20 pF, etc.

The connection from the reference source 70 to the shield plate 64 extends through the capacitors 93. Such may advantageously provide a more stable voltage to the shield plate than would be achieved in the absence of the capacitors. The overall capacitance provided between the plate 64 and the source 70 may be within the range of from about 3 pF to about 30 pF, within the range of from about 5 pF to about 20 pF, etc.

In some embodiments, the upper deck 16 may be considered to comprise the first and second conductive lines 33 and 52, and the gating line 94 may be considered to be a third conductive line which is parallel to the second conductive lines 33, and which is laterally offset from such second conductive lines 33. Analogously, the lower deck 14 may be considered to comprise the first and second conductive lines 50 and 31, and the gating line 88 may be considered to be a third conductive line which is parallel to the conductive lines 31, and which is laterally offset from the conductive lines 31.

The gating lines 88 and 94 are directly over the fragments (conductive structures) 86 and 92, respectively.

In some embodiments, the active structures (semiconductor pillars 80) associated with the memory cells (30, 36) may be considered to be a first set of the active structures, and the active structures (semiconductor pillars 80) associated with the access capacitors (87, 93) may be considered to be a second set of the active structures. The wordlines (31, 33) may be considered to be operatively proximate the active structures of the first set, and the gating lines (88, 94) may be considered to be operatively proximate the active structures of the second set. It is noted that all of the illustrated the active structures 80 may comprise the source/drain regions 44, 46, and channel regions 48; with some of such regions being illustrated in FIG. 7B.

In the illustrated embodiment of FIGS. 7A and 7B, the capacitor plate (plate electrode) 54 extends across all of the memory cell capacitors 34, and also extends across all of the access capacitors 87. Similarly, the capacitor plate (plate electrode) 56 extends across all of the memory cell capacitors 40, and also extends across all of the access capacitors 93.

The gating structures (gating lines) 88 and 94 may be operated to provide desired voltage to the plates 54 and 64 during operation of the memory cells 30 and 36 within the memory arrays. In some applications, the gating lines 88 and 94 may be continuously ON during operation of the memory cells 30 and 36 within the memory arrays; with the ON state corresponding to a state in which the gating lines (88, 94) provide sufficient voltage along the active regions 80 to couple the capacitors (87, 93) with the conductive structures (86, 92). In other embodiments, the voltage along one or both of the gating lines 88 and 94 may be modulated to tailor the voltage along one or both of plates 54 and 64 during operation of the memory cells. For instance, in some embodiments it may be found that the shield lines 60 not need to be at a specific voltage to achieve desired shielding between the digit lines 52 during all operational modes of a memory array; and accordingly the gating line 94 may be in an OFF state during at least some operational modes of a memory array (with the OFF state corresponding to a state in which the gating line 94 does not provide sufficient voltage along the active regions 80 to couple the capacitors 93 with the conductive structures 92).

In some embodiments, the first deck 14 may be considered to comprise first digit lines 50, first wordlines 31, and first memory cells 30; and the second deck 16 may be considered to comprise second digit lines 52, second wordlines 33, and second memory cells 36. The first memory cells 30 comprise first capacitors 34, and the second memory cells 36 comprise second capacitors 40. The first deck 14 comprises a first plate electrode 54 shared by the first capacitors 34, and the second deck 16 comprises a second plate electrode 56 shared by the second capacitors 40. The shield lines 58 of the first deck 14 may be considered to be first shield lines, and the shield lines 60 of the second deck may be considered to be second shield lines. The first shield lines 58 extend upwardly from the shield plate 62 (which may be referred to as a first shield plate), and the second shield lines 60 extend upwardly from the shield plate 64 (which may be referred to as a second shield plate).

The access capacitors 87 may be referred to as first access capacitors, and the access capacitors 93 may be referred to as second access capacitors.

The active structures 80 within the first deck 14 may be considered to be first active structures, and the active structures 80 within the second deck 16 may be considered to be second active structures. The first active structures over the first digit lines 50 may be considered to be a first set of the first active structures, and the first active structures over the interconnect structure 102 may be considered to be a second set of the first active structures. Similarly, the second active structures over the second digit lines 52 may be considered to be a first set of the second active structures, and the second active structures over the interconnect structure 104 may be considered to be a second set of the second active structures.

The voltage source 72 may be considered to be a first voltage source which is electrically coupled to the shield plate 62, and which is electrically coupled from the shield plate 62 to the first plate electrode 54 through the first access capacitors 87.

The voltage source 70 may be considered to be a second voltage source which is electrically coupled to the second capacitor plate electrode 56, and which is electrically coupled from the second capacitor plate electrode to the second shield lines 60 through the second access capacitors 93.

In some embodiments, the first and second voltage sources 70 and 72 may be at the same voltage as one another; and may be, for example, at ground voltage, at about VCC/2, etc. In some embodiments, the voltage sources 70 and 72 may be part of a common voltage source.

Figure 8:
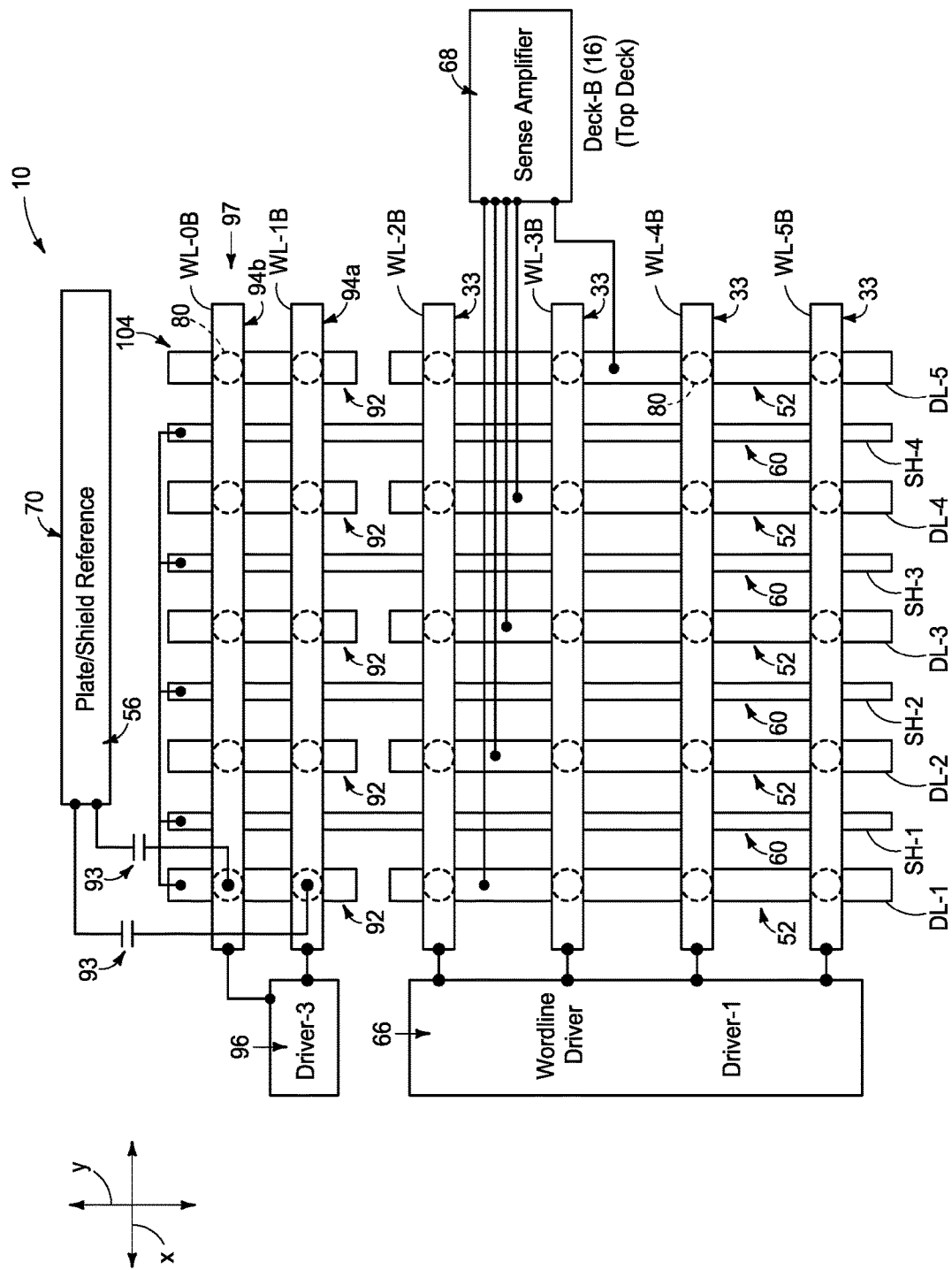

In some embodiments, one or both of the interconnect regions 95 and 97 may include more than one row of the access capacitors. FIG. 8 shows the top deck 16 of the assembly 10 in a configuration analogous to that described above with reference to FIG. 6, but in an arrangement in which the interconnect region 97 includes two rows of the access capacitors. The access capacitors are not visible in the view of FIG. 8, but would be over the pillars 80 analogous to the configurations shown in FIGS. 7A and 7B. The interconnect region 97 includes two of the gating lines 94, with such gating lines being labeled 94a and 94b. The gating lines 94a and 94b are coupled with a driver 96. The gating lines 94a and 94b may or may not be in a continuous ON operational state during operation of the memory array associated with the digit lines 52.

In some applications it may be desired to utilize two or more gating structures 94 within the top deck 16 so that the shield lines 60 may be subdivided amongst two or more sets which are independently controlled relative to one another. Example embodiments are described with reference to FIG. 9-11.

Figure 9:
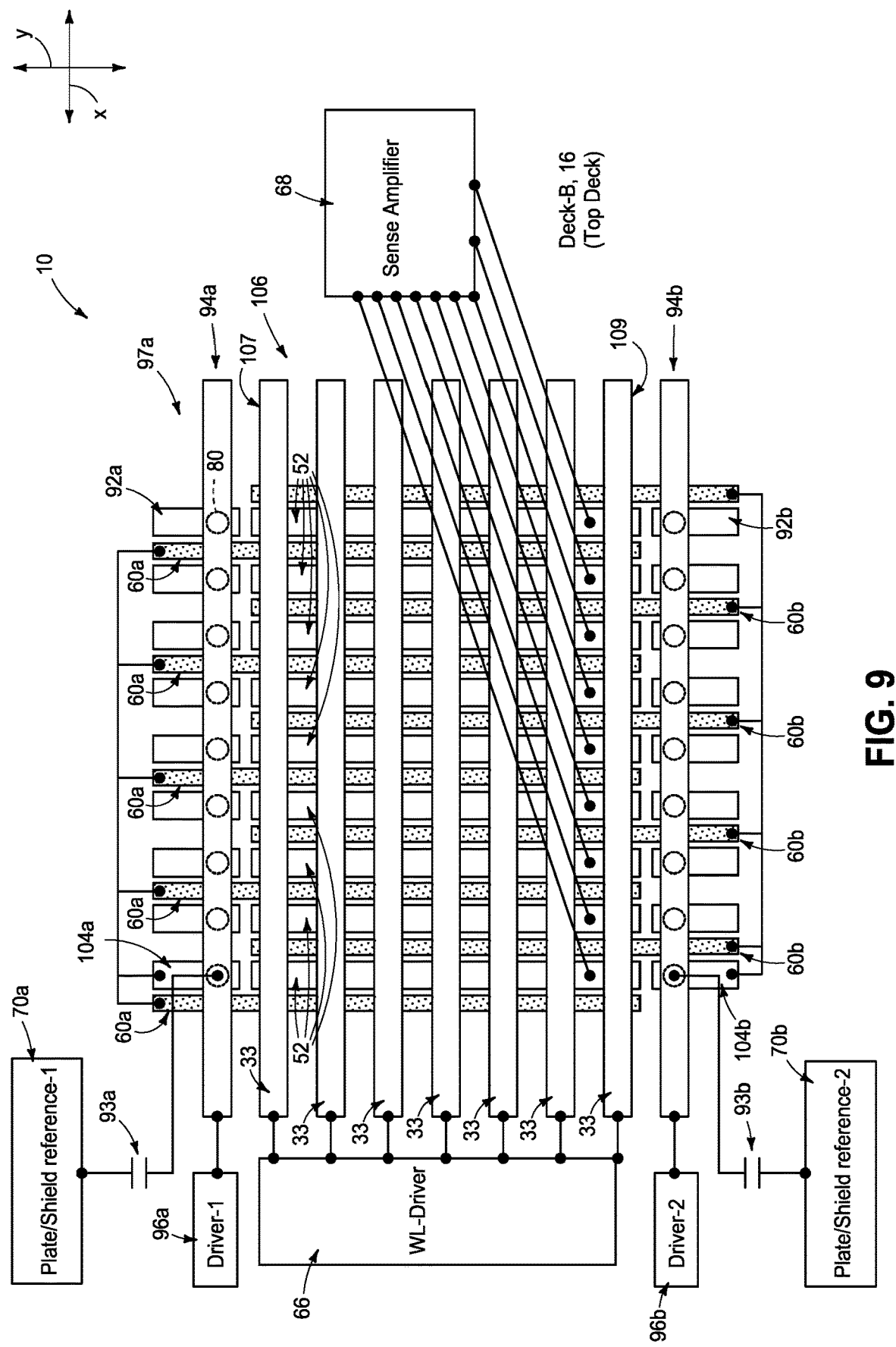

Referring to FIG. 9, the assembly 10 is shown to comprise the digit lines 52 within a central region of the assembly. The digit lines may be within a memory array region 106. Such memory region has a first edge (side) 107, and an opposing second edge (side) 109. Regions of the digit lines 52 extending beyond the second edge 107 are broken from the portions of the digit lines within the memory region to form fragments 92a, and similarly regions of the digit lines extending beyond the second side 109 are formed into fragments 92b. The fragments 92a are within a first interconnect structure 104a, and the fragments 92b are within a second interconnect structure 104b. In some embodiments, the interconnect structures 104a and 104b may be referred to as second and third interconnect structures to distinguish them from any first interconnect structure 88 associated with the lower deck 14 (such as the interconnect structure 88 described above with reference to FIGS. 5, 7A and 7B).

A first gating line at 94a extends across the interconnect structure 104a, and a second gating line 94b extends across the interconnect structure 104b.

The shield lines 60 are shown with stippling so that they may be readily distinguished from the digit lines 52 and the fragments 92. The shield lines are subdivided amongst a first set comprising shield lines 60a and a second set comprising shield lines 60b. The shield lines 60a are electrically coupled with one another, and are coupled to a first reference source 70a through access capacitors 93a; and the shield lines 60b are electrically coupled with one another, and are coupled to a second reference source 70b through access capacitors 93b. The reference sources 70a and 70b may or may not be at the same voltage as one another, and may or may not be part of a common reference source. In some embodiments, the reference sources 70a and 70b may be part of a common reference source which is at a suitable voltage (e.g., ground, VCC/2, etc.)

In some embodiments, the digit lines 52 may be considered to be spaced from one another by gaps. The shield lines 60a may be considered to be within some of the gaps between the digit lines, and the shield lines 60b may be considered to be within others of the gaps between the digit lines.

In some embodiments, the shield lines 58 associated with the lower deck 14 (described above with reference to FIGS. 5, 7A and 7B) may be referred to as first shield lines, the shield lines 60a may be referred to as second shield lines, and the shield lines 60b may be referred to as third shield lines. The second shield lines 60a are electrically coupled with the interconnect structure 104a, and the third shield lines 60b are electrically coupled with the interconnect structure 104b.

In some embodiments, the access capacitors 87 of the lower deck 14 (shown in FIG. 7A) may be referred to as first access capacitors. In such embodiments, the access capacitors 93a may be referred to as second access capacitors, and the access capacitors 93b may be referred to as third access capacitors. The second access capacitors 93a may be over the gating line 94a in a configuration analogous to that described above with reference to FIGS. 7A and 7B, and similarly the third access capacitors 93b may be over the gating line 94b.

The access capacitors 93a and 93b may be configured identically to the capacitors 93 described above with reference to FIGS. 7A and 7B, and accordingly may be over active structures 80, with such active structures being operatively proximate the gating lines 94 a and 94b. The active structures 80 proximate the access transistors 93a may be referred to as first active structures, and the active structures 80 proximate the second access transistors 93b may be referred to as second active structures.

In the illustrated embodiment of FIG. 9, the first and second shield structures 60a and 60b alternate with one another along the x-axis direction.

The gating lines 94a and 94b are coupled with drivers 96a and 96b, and may be operated independently of one another. In some embodiments, the gating lines 94a and 94b may remain in an ON state during an entire duration of the operation of the memory array 106 (and accordingly will be at substantially the same voltage as one another for the entire duration of the operation of the memory array). In other embodiments, the gating lines 94a and 94b may be at different voltages relative to one another for at least a portion of duration of the operation of the memory array 106. For instance, the voltage along individual shield lines may be adjusted depending on whether digit lines adjacent the shield lines are active or not. Accordingly, the utilization of multiple gating lines (94a, 94b) may enable operational characteristics of the assembly 10 to be tailored for particular applications; and specifically may enable one set of the shield lines (e.g., the set comprising shield lines 60a) to be operated independently of another set (e.g., the set comprising shield lines 60b).

The drivers 96a and 96b may be separate from another (as shown), and may be separate from the primary wordline driver 66. Alternatively, the drivers 66, 96a and 96b may be part of a common driver circuitry.

Figure 10:
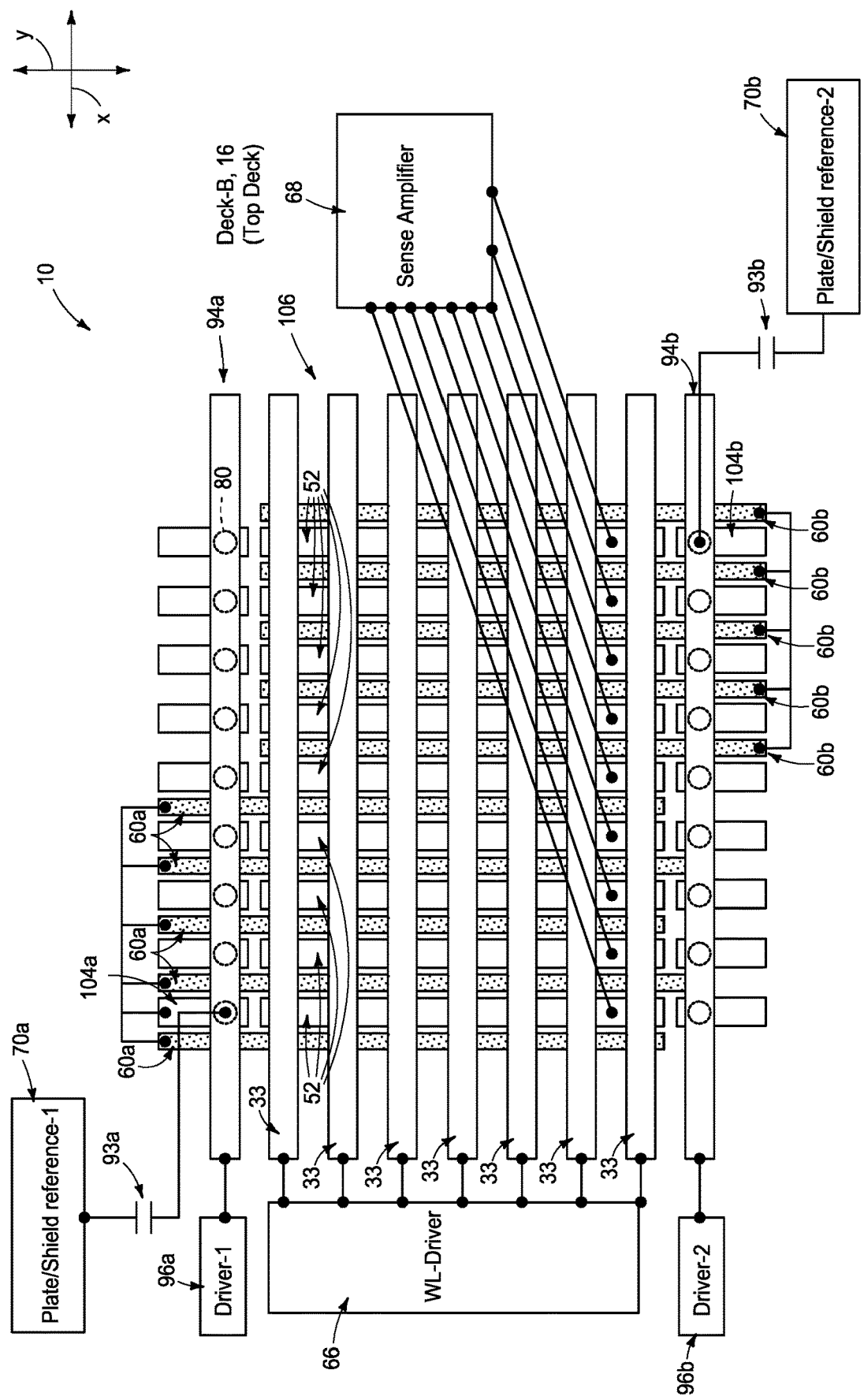

FIG. 10 shows the assembly 10 in a configuration similar to that of FIG. 9; but shows the shield structures 60a in a first arrangement (batch), and the shield structures 60b in a second arrangement (batch); with the second arrangement being laterally offset from the first arrangement.

Figure 11:
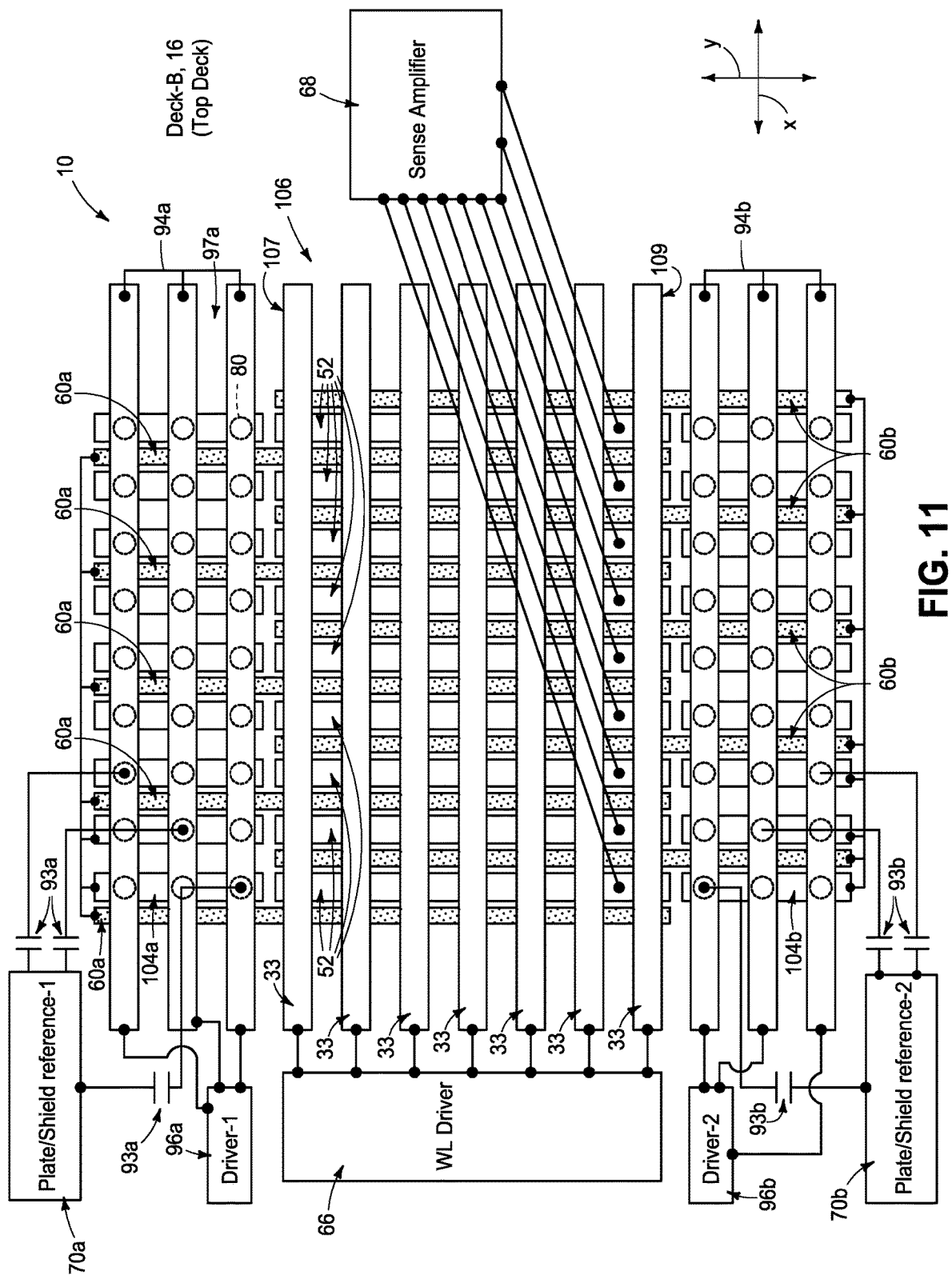

FIG. 11 shows a configuration similar to that of FIG. 9, but shows the gate lines 93a and 93b within electrically ganged (electrically coupled, electrically tied) arrangements.

Although various embodiments are described above relative to multi-deck architectures comprising two memory decks, it is to be understood that the embodiments may be extended to be utilized with multi-deck architectures comprising more than two memory decks.

The various cross-sectional views are provided to show primary structures associated with the embodiments described herein. Additional secondary structures may or may not be present, as will be understood by persons of ordinary skill. For instance, insulative materials would generally be provided around exposed surfaces of the illustrated conductive materials, gate dielectric material would be provided between the wordlines (31, 33) and channel regions 48 of the active structures 80, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure.

The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first conductive lines which extend along a first direction, and having second conductive lines over the first conductive lines and which extend along a second direction that crosses the first direction. Capacitors are over the second conductive lines. The second conductive lines are operatively proximate active structures to gatedly couple a first set of the capacitors to the first conductive lines through the active structures. Shield structures are between the first conductive lines and extend along the first direction. A voltage source is electrically coupled to the shield structures through a second set of the capacitors.

Some embodiments include an integrated assembly having first conductive lines which extend along a first direction, and having second conductive lines over the first conductive lines and which extend along a second direction that crosses the first direction. Capacitors are over the second conductive lines. Each of the capacitors comprises a first electrode over the second conductive lines, a second electrode over the first electrode, and an insulative material between the first and second electrodes. The second electrodes are regions of a plate electrode. The plate electrode extends across all of the capacitors. The second conductive lines are operatively proximate active structures to gatedly couple a first set of the capacitors to the first conductive lines through the active structures. Shield structures are between the first conductive lines and extend along the first direction. The shield structures extend upwardly from a shield plate. A reference source is electrically coupled to the shield plate, and is electrically coupled from the shield plate to the plate electrode through a second set of the capacitors.

Some embodiments include an integrated assembly comprising a first deck, and a second deck over the first deck. The first deck comprises first digit lines and first memory cells coupled with the first digit lines. The first memory cells comprise first capacitors and a first plate electrode shared by the first capacitors. The first deck also comprises first shield lines between the first digit lines. The first shield lines extend upwardly from a shield plate. The second deck comprises second digit lines, and second memory cells coupled with the second digit lines. The second memory cells comprise second capacitors and a second plate electrode shared by the second capacitors. Second shield lines are between the second digit lines. A first voltage source is electrically coupled to the shield plate, and is electrically coupled from the shield plate to the first plate electrode through first access capacitors. A second voltage source is electrically coupled to second plate electrode, and is electrically coupled from the second plate electrode to the second shield lines through second access capacitors.

Some embodiments include an integrated assembly comprising a first deck which includes first digit lines, a first interconnect structure laterally offset from the first digit lines, first wordlines over the first digit lines, a first gating line over the first interconnect structure, first memory capacitors over the first wordlines, first access capacitors over the first gating line, a first capacitor plate electrode extending across the first memory capacitors and the first access capacitors and comprising upper electrodes of the first memory capacitors and the first access capacitors, and a first set of first active structures over the first digit lines. The first wordlines are operatively proximate the first active structures of the first set to gatedly couple the first digit lines to the first memory capacitors. The first deck also includes a second set of the first active structures over the first interconnect structure. The first gating line is operatively proximate the first active structures of the second set to gatedly couple the first interconnect structure to the first access capacitors. The first deck also includes first shield lines between the first digit lines and electrically coupled to the first interconnect structure. The first shield lines extend upwardly from a shield plate. A second deck is over the first deck. The second deck includes second digit lines, a second interconnect structure laterally offset from the second digit lines, second wordlines over the second digit lines, a second gating line over the second interconnect structure, second memory capacitors over the second wordlines, second access capacitors over the second gating line, and a second capacitor plate electrode extending across the second memory capacitors and the second access capacitors. The second capacitor plate electrode comprises upper electrodes of the second memory capacitors and the second access capacitors. The second deck also includes a first set of second active structures over the first digit lines. The second wordlines are operatively proximate the second active structures of the first set to gatedly couple the second digit lines to the second memory capacitors. The second deck also includes a second set of the second active structures over the second interconnect structure. The second gating line is operatively proximate the second active structures of the second set to gatedly couple the second interconnect structure to the second access capacitors. The second deck also includes second shield lines between the second digit lines and electrically coupled to the second interconnect structure.

A first voltage source is electrically coupled to the shield plate, and is electrically coupled from the shield plate to the first capacitor plate electrode through the first access capacitors. A second voltage source is electrically coupled to second capacitor plate electrode, and is electrically coupled from the second capacitor plate electrode to the second shield lines through the second access capacitors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   first conductive lines extending along a first direction;
   second conductive lines over the first conductive lines and extending along a second direction which crosses the first direction;
   capacitors over the second conductive lines; the second conductive lines being operatively proximate active structures to gatedly couple a first set of the capacitors to the first conductive lines through the active structures;
   shield structures between the first conductive lines and extending along the first direction; and
   a voltage source electrically coupled to the shield structures through a second set of the capacitors.

2. The integrated assembly of claim 1 wherein the first conductive lines are electrically coupled with sense-amplifier-circuitry, and wherein the second conductive lines are electrically coupled with driver circuitry.

3. The integrated assembly of claim 1 wherein the active structures are vertically-extending pillars of semiconductor material.

4. The integrated assembly of claim 1 wherein the second set of the capacitors provides a total capacitance within a range of from about 3 pF to about 30 pF.

5. The integrated assembly of claim 1 wherein the shield structures are a first set of the shield structures, and wherein the voltage source is a first voltage source; and further comprising a second set of the shield structures electrically coupled to a second voltage source through a third set of the capacitors.

6. The integrated assembly of claim 5 the wherein:
   the capacitors of the first set are comprised by memory cells of a memory array region;
   the first voltage source couples to the shield structures of the first set from a first side of the memory array region; and
   the second voltage source couples to the shield structures of the second set from a second side of the memory array region, with the second side being in opposing relation to the first side.

7. The integrated assembly of claim 6 wherein the shield structures of the first set alternate with the shield structures of the second set along the second direction.

8. The integrated assembly of claim 6 wherein:
   the shield structures of the first set form a first arrangement of the shield structures;
   the shield structures of the second set form a second arrangement of the shield structures; and
   the second arrangement is laterally offset from the first arrangement.

9. The integrated assembly of claim 1 wherein the active structures are a first set of the active structures, and further comprising:
   conductive structures laterally offset from the first conductive lines;
   a third conductive line parallel to the second conductive lines and laterally offset from the second conductive lines; the third conductive line being directly over regions of the conductive structures;
   the capacitors of the second set being over the third conductive line and over the conductive structures;
   a second set of the active structures; the active structures of the second set being between the conductive structures and the capacitors of the second set;
   the third conductive line being operatively proximate the active structures of the second set to gatedly couple the conductive structures to the capacitors of the second set; and
   the shield structures being electrically coupled with at least one of the conductive structures.

10. The integrated assembly of claim 9 wherein the conductive structures are aligned with the first conductive lines and are in one-to-one correspondence with the first conductive lines.

11. The integrated assembly of claim 9 wherein the capacitors of the first set are comprised by memory cells of a memory array; and wherein the third conductive line is in a continuous ON state during operation of memory cells of the memory array.

12. The integrated assembly of claim 9 wherein the capacitors of the first set are comprised by memory cells of a memory array; and wherein the third conductive line is not in a continuous ON state during operation of memory cells of the memory array.

13. The integrated assembly of claim 9 wherein each of the capacitors of the first and second sets includes:
   a first node configured as an upwardly-opening container;
   a second node over the first node and extending into the upwardly-opening container; and
   an insulative material between the first and second nodes.

14. The integrated assembly of claim 13 wherein the second nodes are part of a continuous conductive expanse that extends across the capacitors of the first and second sets.

15. The integrated assembly of claim 1 wherein the shield structures extend upwardly from a conductive plate, with said conductive plate extending to under the first conductive lines.

16. An integrated assembly, comprising:
   first conductive lines extending along a first direction;
   second conductive lines over the first conductive lines and extending along a second direction which crosses the first direction;
   capacitors over the second conductive lines; each of the capacitors comprising a first electrode over the second conductive lines, a second electrode over the first electrode, and an insulative material between the first and second electrodes; the second electrodes being regions of a plate electrode; the plate electrode extending across all of the capacitors; the second conductive lines being operatively proximate active structures to gatedly couple a first set of the capacitors to the first conductive lines through the active structures;
   shield structures between the first conductive lines and extending along the first direction; the shield structures extending upwardly from a shield plate; and a reference source electrically coupled to the shield plate, and electrically coupled from the shield plate to the plate electrode through a second set of the capacitors.

17. The integrated assembly of claim 16 wherein the first conductive lines are electrically coupled with sense-amplifier-circuitry, and wherein the second conductive lines are electrically coupled with driver circuitry.

18. The integrated assembly of claim 16 wherein the active structures are vertically-extending pillars of comprising silicon.

19. The integrated assembly of claim 16 wherein the second set of the capacitors provides a total capacitance within a range of from about 3 pF to about 30 pF.

20. The integrated assembly of claim 16 wherein the second set of the capacitors provides a total capacitance within a range of from about 5 pF to about 20 pF.

21. The integrated assembly of claim 16 wherein the active structures are a first set of the active structures, and further comprising:
- conductive structures laterally offset from the first conductive lines;
- a third conductive line parallel to the second conductive lines and laterally offset from the second conductive lines; the third conductive line being directly over regions of the conductive structures;
- the capacitors of the second set being over the third conductive line and over the conductive structures;
- a second set of the active structures; the active structures of the second set being between the conductive structures and the capacitors of the second set;
- the third conductive line being operatively proximate the active structures of the second set to gatedly couple the conductive structures to the capacitors of the second set; and
- the shield plate being electrically coupled with at least one of the conductive structures.

22. The integrated assembly of claim 21 wherein the conductive structures are aligned with the first conductive lines and are in one-to-one correspondence with the first conductive lines.

23. The integrated assembly of claim 16 wherein the first nodes are configured as upwardly-opening containers, and wherein the second nodes extend into the upwardly-opening containers.

24. An integrated assembly, comprising:
- a first deck comprising:
  - first digit lines;
  - first memory cells coupled with the first digit lines; the first memory cells comprising first capacitors and a first plate electrode shared by the first capacitors; and
  - first shield lines between the first digit lines; the first shield lines extending upwardly from a shield plate;
- a second deck over the first deck and comprising:
  - second digit lines;
  - second memory cells coupled with the second digit lines; the second memory cells comprising second capacitors and a second plate electrode shared by the second capacitors; and
  - second shield lines between the second digit lines;
- a first voltage source electrically coupled to the shield plate, and electrically coupled from the shield plate to the first plate electrode through first access capacitors; and
- a second voltage source electrically coupled to second plate electrode, and electrically coupled from the second plate electrode to the second shield lines through second access capacitors.

25. The integrated assembly of claim 24 wherein the first and second voltage sources are at the same voltage as one another.

26. The integrated assembly of claim 25 wherein the first and second voltage sources are at ground.

27. The integrated assembly of claim 25 wherein the first and second voltage sources are at VCC/2.

28. The integrated assembly of claim 24 wherein the second memory cells are within a memory array, and wherein the second shield lines are subdivided between at least two sets which are operated independently of one another during operation of the memory array.

29. An integrated assembly, comprising:
- a first deck comprising:
  - first digit lines;
  - a first interconnect structure laterally offset from the first digit lines;
  - first wordlines over the first digit lines;
  - a first gating line over the first interconnect structure;
  - first memory capacitors over the first wordlines;
  - first access capacitors over the first gating line;
  - a first capacitor plate electrode extending across the first memory capacitors and the first access capacitors and comprising upper electrodes of the first memory capacitors and the first access capacitors;
  - a first set of first active structures over the first digit lines, the first wordlines being operatively proximate the first active structures of the first set to gatedly couple the first digit lines to the first memory capacitors;
  - a second set of the first active structures over the first interconnect structure, the first gating line being operatively proximate the first active structures of the second set to gatedly couple the first interconnect structure to the first access capacitors; and
  - first shield lines between the first digit lines and electrically coupled to the first interconnect structure; the first shield lines extending upwardly from a shield plate;
- a second deck over the first deck and comprising:
  - second digit lines;
  - a second interconnect structure laterally offset from the second digit lines;
  - second wordlines over the second digit lines;
  - a second gating line over the second interconnect structure;
  - second memory capacitors over the second wordlines;
  - second access capacitors over the second gating line;
  - a second capacitor plate electrode extending across the second memory capacitors and the second access capacitors and comprising upper electrodes of the second memory capacitors and the second access capacitors;
  - a first set of second active structures over the first digit lines, the second wordlines being operatively proximate the second active structures of the first set to gatedly couple the second digit lines to the second memory capacitors;
  - a second set of the second active structures over the second interconnect structure, the second gating line being operatively proximate the second active structures of the second set to gatedly couple the second interconnect structure to the second access capacitors; and
  - second shield lines between the second digit lines and electrically coupled to the second interconnect structure;

a first voltage source electrically coupled to the shield plate, and electrically coupled from the shield plate to the first capacitor plate electrode through the first access capacitors; and a second voltage source electrically coupled to second capacitor plate electrode, and electrically coupled from the second capacitor plate electrode to the second shield lines through the second access capacitors.

30. The integrated assembly of claim 29 wherein the second deck includes a third interconnect structure laterally offset form the second digit lines, and on an opposing side of the second digit lines relative to the second interconnect structure; wherein the second digit lines are spaced from one another by gaps; wherein the second shield lines are within some of the gaps; wherein third shield lines are within others of the gaps; and wherein the third shield lines are electrically coupled to the third interconnect structure.

31. The integrated assembly of claim 30 wherein a third gating line is over the a third interconnect structure; wherein third access capacitors are over the third gating line;

wherein a third set of the second active structures are over the third interconnect structure;

wherein the third gating line is operatively proximate the second active structures of the third set to gatedly couple the third interconnect structure to the third access capacitors; and wherein the second memory capacitors are within memory cells of a memory array.

32. The integrated assembly of claim 31 wherein the second and third gating lines remain in an ON state during operation of the memory array.

33. The integrated assembly of claim 31 wherein the second and third gating lines are at a substantially same voltage as one another for an entire duration of operation of the memory array.

34. The integrated assembly of claim 31 wherein the second and third gating lines are at different voltages relative to one another for at least a portion of a duration of operation of the memory array.

35. The integrated assembly of claim 29 wherein the first and second voltage sources are at the same voltage as one another.

* * * * *

UNITED STATES PATENT AND TRADEMARK OFFICE
CERTIFICATE OF CORRECTION

PATENT NO. : 11,437,381 B2
APPLICATION NO. : 16/785942
DATED : September 6, 2022
INVENTOR(S) : Jiyun Li and Scott J. Derner It is certified that error appears in the above-identified patent and that said Letters Patent is hereby corrected as shown below:

On the Title Page

(71) Applicant – Replace "Micron Technology, inc., Boise, ID (US)" with --Micron Technology, Inc., Boise, ID (US)--

In the Claims

Column 15, Line 48 – Replace "claim 5 the wherein:" with --claim 5 wherein:--

Column 19, Line 11 – Replace "offset form the" with --offset from the--

Signed and Sealed this
Eighth Day of November, 2022

Katherine Kelly Vidal
*Director of the United States Patent and Trademark Office*